US008707125B2

(12) United States Patent
Jeong et al.

(10) Patent No.: US 8,707,125 B2
(45) Date of Patent: Apr. 22, 2014

(54) METHOD AND APPARATUS FOR TRANSMITTING AND RECEIVING DATA IN A COMMUNICATION SYSTEM

(75) Inventors: Hong-Sil Jeong, Seoul (KR); Sung-Ryul Yun, Suwon-si (KR); Jae-Yoel Kim, Suwon-si (KR); Hyun-Koo Yang, Seoul (KR); Hak-Ju Lee, Incheon (KR); Se-Ho Myung, Suwon-si (KR); Jin-Hee Jeong, Yongin-si (KR)

(73) Assignee: Samsung Electronics Co., Ltd (KR)

( * ) Notice: Subject to any disclaimer, the term of this patent is extended or adjusted under 35 U.S.C. 154(b) by 682 days.

(21) Appl. No.: 12/949,408

(22) Filed: Nov. 18, 2010

(65) Prior Publication Data
US 2011/0119568 A1 May 19, 2011

(30) Foreign Application Priority Data

Nov. 18, 2009 (KR) .................. 10-2009-0111489
Dec. 3, 2009 (KR) .................. 10-2009-0119207
Jan. 6, 2010 (KR) .................. 10-2010-0001007
Nov. 12, 2010 (KR) .................. 10-2010-0112601

(51) Int. Cl.
*H03M 13/00* (2006.01)
(52) U.S. Cl.
USPC .................... 714/758; 714/790; 714/800
(58) Field of Classification Search
USPC .................... 714/752, 758, 790, 800, 804
See application file for complete search history.

(56) References Cited

U.S. PATENT DOCUMENTS

| 5,546,409 | A | * | 8/1996 | Karasawa | 714/755 |
|---|---|---|---|---|---|
| 7,114,121 | B2 | | 9/2006 | Oda | |
| 7,979,776 | B2 | | 7/2011 | Hwang et al. | |
| 8,527,834 | B2 | | 9/2013 | Nakao et al. | |
| 2003/0005387 | A1 | | 1/2003 | Tsunoda | |
| 2005/0193308 | A1 | * | 9/2005 | Shin | 714/752 |
| 2007/0061690 | A1 | * | 3/2007 | Stewart et al. | 714/800 |
| 2007/0089025 | A1 | * | 4/2007 | Hong et al. | 714/758 |
| 2007/0226583 | A1 | * | 9/2007 | Kim et al. | 714/758 |
| 2008/0098286 | A1 | * | 4/2008 | Chugg et al. | 714/790 |
| 2009/0154458 | A1 | | 6/2009 | Kim et al. | |
| 2009/0164873 | A1 | | 6/2009 | Pekonen et al. | |

(Continued)

FOREIGN PATENT DOCUMENTS

| GB | 2 483 238 | 3/2012 |
|---|---|---|
| JP | 11-136220 | 5/1999 |

(Continued)

OTHER PUBLICATIONS

Hyo Yol Park et al., "Structured Puncturing for Rate-Compatible B-LDPC Codes with Dual-Diagonal Parity Structure", IEEE Transactions on Wireless Communications, Oct. 2008.

(Continued)

*Primary Examiner* — Joshua Lohn
(74) *Attorney, Agent, or Firm* — The Farrell Law Firm, P.C.

(57) ABSTRACT

A method for transmitting encoded data, which improves a diversity effect in a communication system, including generating parity bits for an information word, generating a codeword by encoding an information word using the generated parity bits, puncturing some of the parity bits of the codeword, transmitting a frame including the information word, and generating additional parity bits for decoding the information word and transmitting the additional parity bits in one or more other frames.

68 Claims, 23 Drawing Sheets

(56) References Cited

U.S. PATENT DOCUMENTS

| | | | |
|---|---|---|---|
| 2009/0268694 A1* | 10/2009 | Sun et al. | 370/336 |
| 2010/0005361 A1 | 1/2010 | Matsumoto | |
| 2010/0115372 A1* | 5/2010 | Trachewsky et al. | 714/752 |
| 2011/0041023 A1 | 2/2011 | Shimezawa et al. | |
| 2011/0119568 A1* | 5/2011 | Jeong et al. | 714/790 |

FOREIGN PATENT DOCUMENTS

| | | |
|---|---|---|
| JP | 2003-224544 | 8/2003 |
| JP | 2008-005419 | 1/2008 |
| JP | 2009-526341 | 7/2009 |
| JP | 4350750 | 7/2009 |
| KR | 1020070034904 | 3/2007 |
| KR | 1020070054088 | 5/2007 |
| KR | 1020080105843 | 12/2008 |
| WO | WO 2008/086236 | 7/2008 |
| WO | WO 2009/064468 | 5/2009 |
| WO | WO 2009/131094 | 10/2009 |
| WO | WO 2010/100575 | 9/2010 |
| WO | WO 2011/061031 | 5/2011 |

OTHER PUBLICATIONS

European Standard, Digital Video Broadcasting (DVB); Frame Structure Channel Coding and Modulation for a Second Generation Digital Terrestrial Television Broadcasting System (DVB-T2), ETSI EN 302 755 V1.3.1, Apr. 2012.

DVB, "Digital Video Broadcasting (DVB); Next Generation Broadcasting System to Handheld, Physical Layer Specification (DVB-NGH)", DVB Document A160, Nov. 2012.

* cited by examiner

METHOD AND APPARATUS FOR TRANSMITTING AND RECEIVING DATA IN A COMMUNICATION SYSTEM

PRIORITY

This application claims priority under 35 U.S.C. §119(a) to Korean Patent Applications filed in the Korean Intellectual Property Office on Nov. 18, 2009, Dec. 3, 2009, Jan. 6, 2010, and Nov. 12, 2010, which were assigned Serial Nos. 10-2009-0111489, 10-2009-0119207, 10-2010-0001007, and 10-2010-0112601, respectively, the entire disclosures of all of which are hereby incorporated by reference.

BACKGROUND OF THE INVENTION

1. Field of the Invention

The present invention relates generally to a communication system, and more particularly, to a transmission and reception method and apparatus for obtaining diversity effects.

2. Description of the Related Art

In wireless communication systems, link performances significantly degrade from various noises and fading of channels, and Inter-Symbol Interference (ISI). Therefore, to realize high-speed digital communication systems providing high data throughput and reliability, such as a next-generation mobile communication system, a digital broadcasting system, and a mobile Internet system, it is important to develop technologies for coping with noise, fading, and ISI. Recently, error-correcting codes have been studied to improve communication reliability by efficiently restoring information distortion.

A Low-Density Parity Check (LDPC) code, which was first introduced in the 1960s, was never commonly implemented due to its implementation complexity far exceeding the then current technology. However, as a turbo code, which was discovered in 1993, shows performance close to the Shannon's channel capability, many studies have been conducted on iterative decoding and graph-based channel encoding, along with many interpretations that have been made on the performance and characteristics of the turbo code. Upon this opportunity, the LDPC code was restudied in late 1990s, proving that the LDPC code also has performance close to Shannon's channel capacity, if decoded by sum-product algorithm-based iterative decoding on a Tanner graph (a specific case of a factor graph) corresponding to the LDPC code.

The LDPC code is commonly defined by a parity check matrix, and can be represented using a bipartite graph called a Tanner graph. An LDPC code is used to generate a codeword including $N_{ldpc}$ bits or symbols by receiving and LDPC-encoding an information word including $K_{ldpc}$ bits or symbols. For convenience of description, only a codeword including $N_{ldpc}$ bits, generated by receiving and LDPC-encoding an information word including $K_{ldpc}$ bits will be considered herein. That is, a codeword $c=[c_0, c_1, c_2, c_3, \ldots, c_{N_{ldpc}-1}]$ is generated by receiving and LDPC-encoding an information word $I=\{i_0, i_1, i_2, \ldots, i_{K_{ldpc}-1}\}$ including $K_{ldpc}$ input bits. That is, the codeword is a bit stream including a plurality of bits, and codeword bits are the bits of the codeword. Similarly, the information word is a bit stream including a plurality of bits, and information bits are the bits of the information word.

For a systematic code, a codeword is generated as $c=[c_0, c_1, c_2, c_3, \ldots, c_{N_{ldpc}-1}]=[i_0, i_1, \ldots, i_{K_{ldpc}-1}, p_0, p_1, \ldots, p_{N_{ldpc}-1}]$, where $P=[p_0, p_1, \ldots, p_{N_{ldpc}-1}]$ represents parity bits, and the number of parity bits is $N_{parity}=N_{ldpc}-K_{ldpc}$.

Because the TLPC code is defined by a parity check matrix, a sequence c satisfying Equation (1) becomes a codeword for an LDPC code.

$$H \cdot c^T = 0 \qquad (1)$$

In Equation (1), $c=[c_0, c_1, c_2, c_3, \ldots, c_{N_{ldpc}-1}]$. The parity check matrix H includes $N_{ldpc}$ columns, and means that an i-th column is associated with an i-th codeword bit $c_i$.

As indicated above, an LDPC code may be represented by a bipartite graph based on a parity check matrix. The bipartite graph means that vertexes constituting the graph are divided into two different types. The LDPC code is represented by a bipartite graph including $N_{ldpc}$ vertexes, which are called variable nodes and check nodes. The variable nodes correspond to encoded bits on a one-to-one basis, meaning that an i-th variable node corresponds to an i-th codeword bit.

FIG. 1 illustrates an example of a parity check matrix H of an LDPC code including four rows and eight columns.

Referring to FIG. 1, the parity check matrix H generates a length-8 LDPC codeword because it has eight columns, which correspond to eight encoded bits, respectively.

FIG. 2 illustrates a Tanner graph corresponding to the parity check matrix H as illustrated in FIG. 1.

Referring to FIG. 2, the Tanner graph of the LDPC code includes eight variable nodes $x_0$ 202, $x_1$ 204, $x_2$ 206, $x_3$ 208, $x_4$ 210, $x_5$ 212, $x_6$ 214, and $x_7$ 216, and four check nodes 218, 220, 222, and 224. An i-th column and a j-th row in the parity check matrix H of the LDPC code correspond to an i-th variable node $x_i$ and a j-th check node, respectively. In addition, a value of 1, i.e., a non-zero value, in the point where an i-th column and a j-th row cross in the parity check matrix H of the LDPC code means that an edge exists between the i-th variable node $x_i$ and the j-th check node on the Tanner graph as illustrated in FIG. 2.

Generally, an LDPC code is decoded using a Tanner graph. That is, variable nodes and check nodes generate messages, and exchange the messages through their edges, thereby performing iterative decoding. Therefore, there are correlations between variable nodes connected to one check node, and the correlations should be considered during shortening and puncturing.

In the Tanner graph of the LDPC code, degrees of variable nodes and check nodes indicate the number of edges connected thereto, and are identical to the number of non-zero entries in columns or rows corresponding to their nodes in the parity check matrix of the LDPC code. For example, in FIG. 2, degrees of variable nodes $x_0$ 202, $x_1$ 204, $x_2$ 206, $x_3$ 208, $x_4$ 210, $x_5$ 212, $x_6$ 214, and $x_7$ 216 are 4, 3, 3, 3, 2, 2, 2, and 2, respectively, and degrees of check nodes 218, 220, 222, and 224 are 6, 5, 5, and 5, respectively. The numbers of non-zero entries in columns in the parity check matrix H of FIG. 1, which correspond to the variable nodes in FIG. 2, are also 4, 3, 3, 3, 2, 2, 2, and 2, respectively, and the numbers of non-zero entries in rows in the parity check matrix H of FIG. 1, which correspond to the check nodes in FIG. 2, are also 6, 5, 5, and 5, respectively. The variable nodes correspond to codeword bits on a one-to-one basis. Therefore, if an i-th variable node corresponds to an i-th codeword bit on a one-to-one basis, a degree of an i-th variable node can be considered as a degree of an i-th codeword bit.

The density of '1' decreases with an increase in $N_{ldpc}$ in the parity check matrix. Generally, because the density of non-zero entries for an LDPC code is inversely proportional to the codeword length $N_{ldpc}$, an LDPC code with a large value for $N_{ldpc}$ has a very low density. The use of "low density" in the name of the LDPC code was derived from this principle.

Because an LDPC code is defined by a parity check matrix, a system stores the parity check matrix in order to apply the LDPC code. Generally, to store an LDPC code, position information of a weight of 1 in the parity check matrix is stored. However, because a codeword length of an LDPC code used in an actual system ranges from hundreds of bits to hundreds of thousands of bits, a memory required to store the position information of a weight of 1 is very large in capacity if the codeword length of the LDPC code is very long.

To overcome these shortcomings, many studies have been conducted on various LDPC codes having specific structures. For an LDPC code having a specific structure, because positions of a weight of 1 are limited in its parity check matrix according to a specific condition, the positions of a weight of 1 can be stored more efficiently.

FIG. 3 illustrates an example of an LDPC code having a specific structure. It is assumed herein that an LDPC code has a systematic structure, in which a codeword includes an information word.

Referring to FIG. 3, the parity check matrix includes an information part (or information word part) and a parity part. The information part includes $K_{ldpc}$ columns, and the parity part includes $N_{parity}=N_{ldpc}-K_{ldpc}$ columns. The number of rows in the parity check matrix is $N_{ldpc}-K_{ldpc}$, which is the same as the number of columns in the parity part.

Here, $N_{ldpc}$ represents a length of an LDPC codeword, $K_{ldpc}$ represents a length of an information word, and $N_{ldpc}-K_{ldpc}$ represents a length of a parity part. The length of a codeword refers to the number of bits included in the codeword. Similarly, the length of an information word refers to the number of bits included in the information word. In addition, integers M and $Q_{ldpc}$ are determined to meet $$Q_{ldpc} = \frac{(N_{ldpc} - K_{ldpc})}{M},$$

and $$\frac{K_{ldpc}}{M}$$

is also an integer. M and $Q_{ldpc}$ are subject to change according to the codeword length and the code rate.

In the parity check matrix illustrated in FIG. 3, positions of a weight of 1 in a $K_{ldpc}$-th column to an $(N_{ldpc}-1)$-th column, which is a part corresponding to the parity bits, have a dual diagonal structure. Therefore, it is noted that degrees of columns corresponding to the parity bits are all 2, except for a degree of the $(N_{ldpc}-1)$-th column, which is 1.

Referring to FIG. 3, in the parity check matrix, a structure of a 0-th column to a $(K_{ldpc}-1)$-th column, i.e., a part corresponding to an information word, can be made according to the following rules.

Rule 1: In the parity check matrix, a total of $$\frac{K_{ldpc}}{M}$$

column groups are generated by grouping $K_{ldpc}$ columns corresponding to an information word on an M-column basis. Columns in each column group are generated according to Rule 2 below.

Rule 2: Positions of 1 in a 0-th column in an i-th $$\left(i = 1, \ldots, \frac{K_{ldpc}}{M}\right)$$

column group are determined. Assuming that a degree of a 0-th column in each i-th column group is represented by $D_i$, if positions of rows with 1 are $R_{i,0}^{(1)}R_{i,0}^{(2)}, \ldots, R_{i,0}^{(D_i)}$, then positions $R_{i,0}^{(k)}$ (k=1, 2, ..., $D_i$) of rows with 1 in a j-th (j=1, 2, ..., M-1) column in an i-th column group are defined as shown in Equation (2) below.

$$R_{i,j}^{(k)} = R_{i,j}^{(k)} + q\bmod(N_{ldpc} - K_{ldpc}) \qquad (2)$$

$$k = 1, 2, \ldots, D_i,$$

$$i = 1, \ldots, \frac{K_{ldpc}}{M},$$

$$j = 1, \ldots, M - 1$$

According to Rules 1 and 2, degrees of columns in an i-th $$\left(i = 1, \ldots, \frac{K_{ldpc}}{M}\right)$$

column group are all equal to $D_1$.

A more detailed example will be described below for a better understanding of a structure of an LDPC code that stores information about the parity check matrix according to above rules. In the following detailed example, for $N_{ldpc}=30$, $K_{ldpc}=15$, M=5, and $Q_{ldpc}=3$, position information of rows with 1 in a 0-th column in each of three column groups may be represented in sequences called "weight-1 position sequences", as shown below.

$$R_{1,0}^{(1)} = 1, \quad R_{1,0}^{(2)} = 2, \quad R_{1,0}^{(3)} = 8, \quad R_{1,0}^{(4)} = 10,$$

$$R_{2,0}^{(1)} = 0, \quad R_{2,0}^{(2)} = 9, \quad R_{2,0}^{(3)} = 13,$$

$$R_{3,0}^{(1)} = 0, \quad R_{3,0}^{(2)} = 14.$$

For convenience, only the weight-1 position sequences for positions of rows with 1 in a 0-th column in each column group are represented on a column group basis, as shown below.

1 2 8 10

0 9 13

0 14

That is, the i-th weight-1 position sequence sequentially represents position information of rows with 1 in an i-th column group.

An LDPC code achieves encoding and decoding for a given number $K_{ldpc}$ of information bits and a given number $N_{ldpc}$ of codeword bits. The number $N_{parity}$ of parity bits is $N_{ldpc}-K_{ldpc}$. If the given number $K_{ldpc}$ of information bits is greater than the number $K_1$ of information bits being input to an encoder, the information bits undergo shortening by $K_{ldpc}-K_1$ before being transmitted. In addition, if the required number $N_{tx\text{-}parity}=N_{tx\_ldpc}-K_1$ of parity bits is less than the number $N_{parity}$ of parity bits, the parity bits undergo puncturing by $N_{parity}-N_{tx-parity}$ before being transmitted. The $N_{tx-parity}$ represents a length of parity bits actually used, and can be calculated based on the length $K_1$ of the input information word and the code rate for transmission. As the actual operations of shortening and puncturing are not directly related to the embodiment of the present invention that will be described below, detailed descriptions of the shortening and puncturing are omitted.

In some cases, when carrying encoded data, Additive White Gaussian Noise (AWGN) channels may ensure very good performance, but fading channels may fail to obtain sufficient diversity. Therefore, a method capable of overcoming this problem is required.

FIG. 4 illustrates OFDM frames in a on a Digital Video Broadcasting the 2nd Generation Terrestrial (DVB-T2) system and a Digital Video Broadcasting Next Generation Handheld (DVB-NGH) system.

Referring to FIG. 4, a plurality of frames each include a plurality of OFMD symbols. One frame includes a P1/P2 symbol part and a data part. Signaling information is mapped to the P1/P2 symbol part, and the mapped information is transmitted on the P1/P2 symbol part. Data other than the signaling information is mapped to the data part, and the mapped data is transmitted on a plurality of OFDM symbols. Accordingly, the data signals are transmitted on a plurality of frames, making it possible to obtain sufficient diversity gain. However, the signaling information cannot obtain sufficient diversity gain, which leads to performance degradation.

SUMMARY OF THE INVENTION

Accordingly, the present invention is designed to address at least the above-described problems and/or disadvantages and to provide at least the advantages described below.

An aspect of the present invention is to provide a method and apparatus for transmitting data with sufficient diversity gain.

Another aspect of the present invention is to provide a method and apparatus for generating parity groups with sufficient diversity gain.

In accordance with an aspect of the present invention, a method is provided for transmitting encoded data by generating parity bits for an information word; generating a codeword by encoding the information word using the generated parity bits; puncturing some of the parity bits of the codeword; transmitting a frame including the information word; and generating additional parity bits for decoding the information word and transmitting the additional parity bits in one or more other frames.

According to another aspect of the present invention, there is provided an apparatus for transmitting encoded data, comprising an encoder for generating parity bits for an information word, and generating a codeword by encoding the information word, a puncturer for puncturing some of the parity bits of the codeword encoded by the encoder, and a framer for generating a frame including the information word, and one or more other frames including additional parity bits for decoding the information word.

According to another aspect of the present invention, there is provided a method for receiving encoded data, comprising receiving a plurality of frames, and obtaining an information word by decoding received frame data, wherein one frame among the plurality of frames includes the information word, and one or more other frames include additional parity bits for decoding the information word.

According to another aspect of the present invention, there is provided an apparatus for receiving encoded data, comprising a demodulator for receiving and demodulating a plurality of frames, and a decoder for obtaining an information word by decoding received frame data, wherein one frame among the plurality of frames includes the information word, and one or more other frames include additional parity bits for decoding the information word.

According to another aspect of the present invention, there is provided a method for transmitting encoded data, comprising generating a codeword by encoding an information word, puncturing some of the parity bits in the generated codeword, transmitting a frame including the punctured codeword, and transmitting additional parity bits for decoding the information word in one or more frames preceding the frame.

According to another aspect of the present invention, there is provided an apparatus for transmitting encoded data, comprising an encoder for generating a codeword by encoding an information word, a puncturer for puncturing some of the parity bits in the generated codeword, and a framer for generating a frame including the punctured codeword, wherein the framer generates a frame such that one or more frames preceding the frame including the punctured codeword include additional parity bits for decoding the information word.

According to another aspect of the present invention, there is provided a method for receiving encoded data, comprising receiving a plurality of frames, wherein some of parity bits are punctured, obtaining positions of the punctured parity bits, and obtaining an information word by decoding data of the received plurality of frames, taking into account the obtained positions of the punctured parity bits, wherein one frame among the plurality of frames includes a punctured codeword, and one or more other frames include additional parity bits for decoding the information word.

According to another aspect of the present invention, there is provided an apparatus for receiving encoded data, comprising a demodulator for receiving and demodulating a plurality of frames, wherein some of parity bits are punctured, a puncturing processor for obtaining positions of the punctured parity bits, and a decoder for obtaining an information word by decoding data of the received plurality of frames, taking into account the obtained positions of the punctured parity bits, wherein one frame among the plurality of frames includes a punctured codeword, and one or more other frames include additional parity bits for decoding the information word.

BRIEF DESCRIPTION OF THE DRAWINGS

The above and other aspects, features, and advantages of certain embodiments of the present invention will be more apparent from the following description taken in conjunction with the accompanying drawings, in which.

Throughout the drawings, the same drawing reference numerals will be understood to refer to the same elements, features and structures.

DETAILED DESCRIPTION OF EMBODIMENTS OF THE INVENTION

Figures 1, 2:
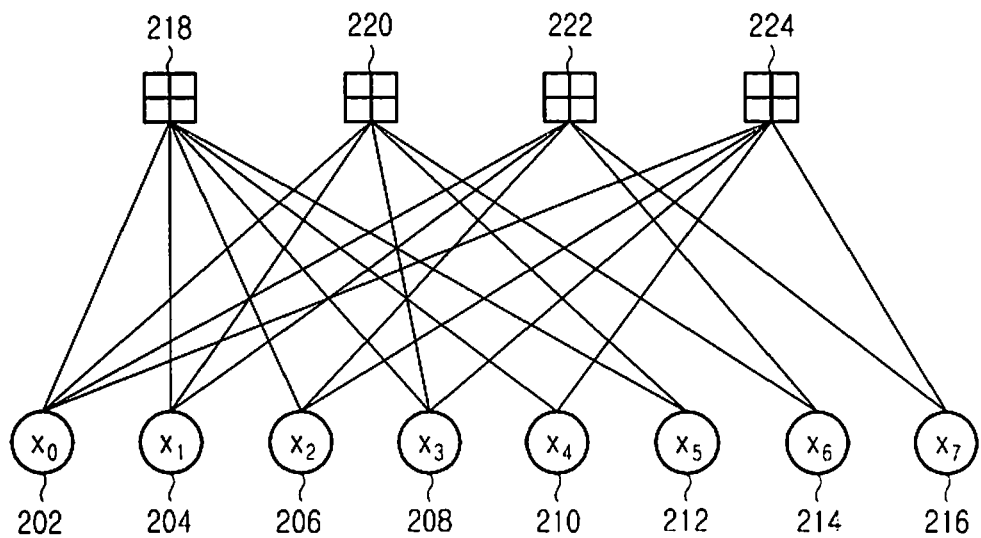
FIG. 1 illustrates a parity check matrix of a length-8 LDPC code.
FIG. 2 illustrates a Tanner graph corresponding to a parity check matrix of a length-8 LDPC code.

Various embodiments of the present invention will be described in detail below with reference to the accompanying drawings. In the following description, specific details such as detailed configuration and components are provided merely to assist in an overall understanding of the described embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

Additionally, while detailed descriptions of the present invention will be made based on a DVB-T2 system and a DVB-NGH system, which are typical European digital broadcasting standards, it will be understood by those of ordinary skill in the art that the present invention is not limited to these systems. In addition, while the present invention will be described in conjunction with a method of transmitting signaling information, the present invention is not limited to transmission of the signaling information.

The codeword described below include two parts, i.e., a first part, which is an information part including actual information words, and a second part, which is a parity part including additional information obtained by receiving and encoding information words. As described above, if needed, a codeword can be created from data by puncturing and shortening.

For convenience of description, it is assumed herein that the term 'codeword' refers to all of an information word and parity bits obtained by encoding the information word. That is, the parity bits include both non-punctured parity bits and punctured parity bits.

If sufficient diversity gain cannot be obtained during transmission of the codeword, an additional diversity gain may be obtained by transmitting data on a plurality of frames.

Method 1

Information words are transmitted in a z-th frame, and additional parity bits are created based on information word and parity bits, which can be obtained by encoding information words. The additional parity bits are transmitted over s frames. Groups of additional parity bits transmitted in associated frames are represented by $G(0), G(1), \ldots, G(s-1)$, and the numbers of bits in the groups are $N_{add\_parity_0}$, $N_{add\_parity_1}, \ldots, N_{add\_parity_{s-1}}$. The additional parity bits are grouped according to specific rules.

The term "additional parity bits" refers to parity bits that are transmitted on frames different from those of information words, separate from the parity bits that are transmitted on the same frames as those of the information words.

As described above, a code is generated based on an $(N_{ldpc}, K_{ldpc})$ code. Accordingly, a puncturing pattern of parity bits, suitable for the code, can be calculated. However, a detailed description of a method for calculating a puncturing pattern will be omitted so as not to obscure the subject matter of the present invention.

The term "puncturing pattern of parity bits" refers to an order of indexes of punctured parity bits. That is, if the number of punctured parity bits is $N_{punc}=2$, then $N_{punc}=2$ elements are sequentially selected in the puncturing pattern and parity bits having the selected values as their indexes are punctured. Assuming that a puncturing pattern set, or a puncturing order, is $A=\{1, 5, 2, 6, 4, 0, 3, 7\}$, if the number of punctured parity bits is 2, then two indexes 1 and 5 are sequentially selected in the puncturing pattern set A. As a result, $p_1$ and $p_5$ are punctured from the parity bits $p_0, p_1, p_2, p_3, p_4, p_5, p_6,$ and $p_7$, and the remaining parity bits $p_0, p_2, p_3, p_4, p_6,$ and $p_7$ are selected as a parity part and transmitted.

For the information word and parity bits, additional parity bits can be created using Rule 3, as described below.

Rule 3

Additional parity bits may be selected from among parity bits and information bits. An order of selecting additional parity bits from the parity bits is based on a puncturing order. In this case, either a normal order or a reverse order of the puncturing pattern may be used. Otherwise, additional parity bits are selected from information bits, and information bits capable of guaranteeing excellent performance are selected in order.

Generally, bits concatenated in an order of a puncturing pattern are created to have a low correlation. That is, the order of the puncturing pattern is determined such that even though both of two concatenated bits suffer from deep fading and are not easily restored, the restoration may be easily achieved by using other bits. For example, when bits concatenated in a normal order or a reverse order of the puncturing pattern are mapped to the same groups and transmitted on the same frames, even though all the frames suffer from deep fading, the restoration may be easily achieved by other parity bits. Therefore, the restoration may be easily achieved by selecting additional parity bits in the normal order or the reverse order of the puncturing pattern as in Rule 3.

In Rule 3, additional parity bits may be created by first determining an order of remaining bits, except for the punctured bits, and then selecting the punctured bits after selecting the non-punctured bits.

In Rule 3, when additional parity bits are selected after the punctured bits are all selected, bits capable of guaranteeing excellent performance may be selected from among information bits and parity bits using a greedy algorithm. The greedy algorithm selects the best performance bits among the codeword bits when primarily selecting additional parity bits, and selects the best performance bits among the remaining bits, with the first selected bits fixed as previously selected bits, when secondarily selecting additional parity bits. The following should be considered in selecting high-performance bits.

1) Degrees of variable nodes corresponding to codeword bits
2) Minimum cycles of variable nodes corresponding to codeword bits
3) Bit Error Rate (BER) performance of codeword bits While two embodiments of selecting additional parity bits using the greedy algorithm will be described below, various other methods are also available.

Additionally, the following descriptions assume that the numbers of elements in groups of additional parity bits are $N_{add\_parity_0}, N_{add\_parity_1}, \ldots, N_{add\_parity_{s-1}}$, and a sum of these values is $N_{total} = N_{add\_parity_0} + \ldots + N_{add\_parity_{s-1}}$.

Embodiment 1

$$N_{total}=N_{add\_parity_0}+\ldots+N_{add\_parity_{s-1}} < N_{ldpc}-K_{ldpc}$$

If a length of a parity part is greater than a sum of the numbers of elements in groups of additional parity bits, groups of additional parity bits are created based on parity bits of a codeword according to order of a puncturing pattern.

Figure 5:
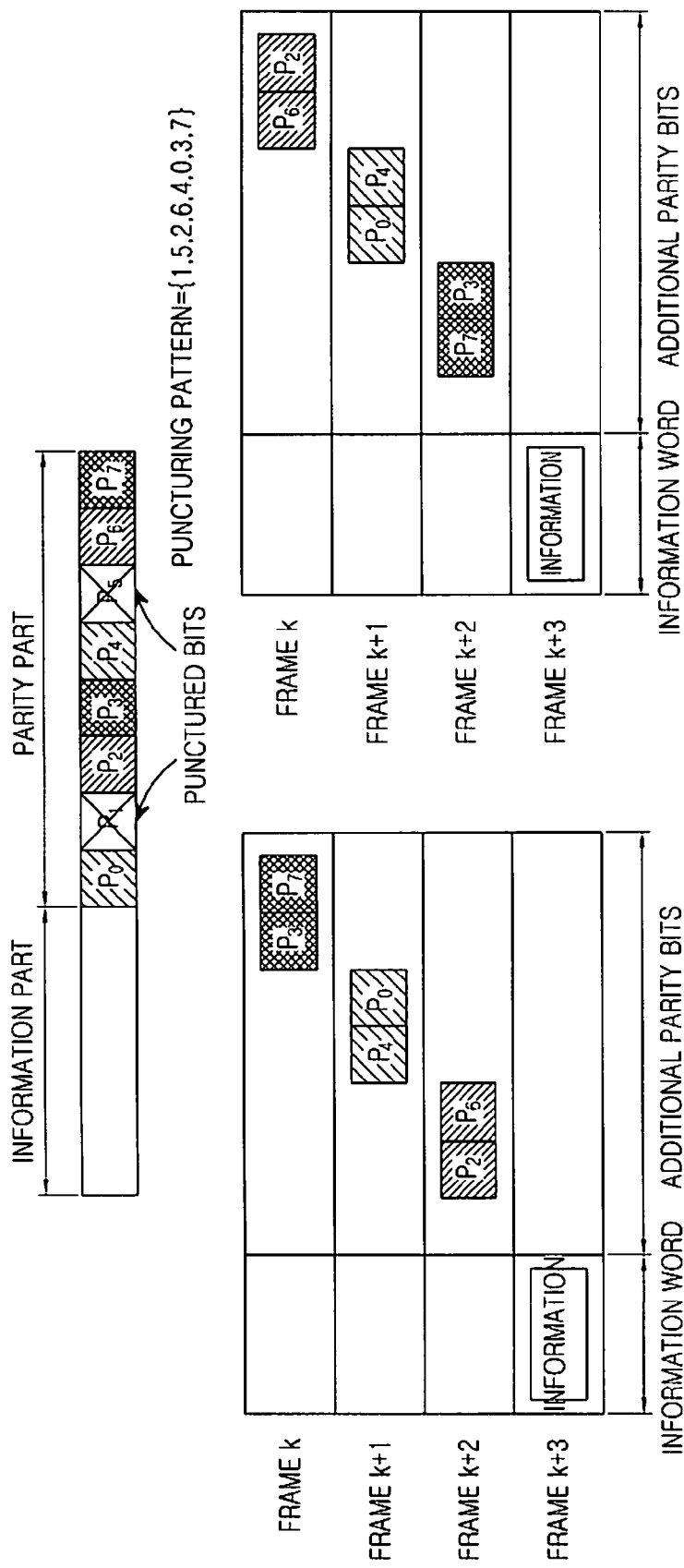
FIG. 5 illustrates a frame structure based on Rule 3 according to an embodiment of the present invention.

FIG. 5 illustrates a frame structure based on Rule 3 according to an embodiment of the present invention.

Referring to FIG. 5, a codeword includes an information part and a parity part. As an example, in FIG. 7, a length of the information part, after undergoing shortening, is 7 bits, $I=\{i_0, i_1, \ldots, i_6\}$, the parity part is 8 bits in length, $P=\{p_0, p_1, p_2, \ldots, p_7\}$, and a puncturing pattern set representing puncturing order is $A=\{1, 5, 2, 6, 4, 0, 3, 7\}$.

For $N_{punc}=2$, $s=3$, and $N_{add\_parity_0}=N_{add\_parity_1}=N_{add\_parity_2}=2$ (where $N_{punc}$ is the number of punctured bits, s is the number of frames on which additional parity bits are transmitted, and $N_{add\_parity_0}$, $N_{add\_parity_1}$, and $N_{add\_parity_2}$ are the numbers of additional parity bits transmitted on their associated frames), groups of additional parity bits are created as follows.

Because the number of punctured bits is 2, $p_1$ and $p_5$ are punctured according to the puncturing pattern set A.

Because elements included in groups of additional parity bits are determined from among the bits $p_0, p_2, p_3, p_4, p_6$, and $p_7$, not the punctured bits $p_1$ and $p_5$, according to the normal puncturing order, a first group is $G(0)=\{p_2, p_6\}$, a second group is $G(1)=\{p_4, p_0\}$, and a third group is $G(2)=\{p_3, p_7\}$. The first group is transmitted on a (k+2)-th frame, the second group on a (k+1)-th frame, and the third group on a k-th frame.

Conversely, if elements included the groups of the additional parity bits are determined from the bits, except for the punctured bits, according to the reverse puncturing order, a first group is $G(0)=\{p_7, p_3\}$, a second group is $G(1)=\{p_0, p_4\}$, and a third group is $G(2)=\{p_6, p_2\}$. The first group is transmitted on a (k+2)-th frame, the second group on a (k+1)-th frame, and the third group on a k-th frame.

While the determined groups are sequentially transmitted, the transmission order of the groups is subject to change.

Embodiment 2

$$N_{total}=N_{add\_parity_0}+\ldots+N_{add\_parity_{s-1}} < N_{ldpc}-K_{ldpc}$$

If a length of a parity part is less than or equal to a sum of the numbers of elements in groups of additional parity bits, groups of additional parity bits are created based on parity bits and information bits of a codeword.

Again, a codeword includes an information part and a parity part. Using the same example as above, a length of the information part, after undergoing shortening, is 7 bits, $I=\{i_0, i_1, \ldots, i_6\}$, the parity part is 8 bits in length and is $P=\{p_0, p_1, p_2, \ldots, p_7\}$, and a puncturing pattern set representing puncturing order is $A=\{1, 5, 2, 6, 4, 0, 3, 7\}$.

For $N_{punc}=2$, $s=3$, and $N_{add\_parity_0}=N_{add\_parity_1}=N_{add\_parity_2}=3$ (where $N_{punc}$ is the number of punctured bits, s is the number of frames on which additional parity bits are transmitted, and $N_{add\_parity_0}$, $N_{add\_parity_1}$, and $N_{add\_parity_2}$ are the numbers of additional parity bits transmitted on their associated frames), groups of additional parity bits are created as follows.

Because the number of punctured bits is 2, $p_1$ and $p_5$ are punctured according to the puncturing pattern set A.

Because elements included groups of additional parity bits are determined according to the normal puncturing order, a first group is $G(0)=\{p_2, p_6, p_4\}$, a second group is $G(1)=\{p_0, p_3, p_7\}$, and a third group is $G(2)=\{p_1, p_5, i_0\}$. Notably, the third group includes the parity bits $p_1$ and $p_5$, which were previously punctured, and one bit $i_0$ from among the codeword bits. The first group is transmitted on a (k+2)-th frame, the second group on a (k+1)-th frame, and the third group on a k-th frame.

Conversely, if the elements included in the groups of the additional parity bits are determined according to the reverse puncturing order, a first group is $G(0)=\{p_7, p_3, p_0\}$, a second group is $G(1)=\{p_4, p_6, p_2\}$, and a third group is $G(2)=\{p_5, p_1, i_0\}$. Likewise, the third group includes the parity bits $p_5$ and $p_1$, which were previously punctured, and one bit $i_0$ among the codeword bits. The first group is transmitted on a (k+2)-th frame, the second group on a (k+1)-th frame, and the third group on a k-th frame.

While the determined groups are sequentially transmitted, the transmission order of the groups is subject to change.

A method for generating a plurality of groups of additional parity bits based on information bits and parity bits in accordance with Rule 3 will be described in more detail below.

Figure 3:
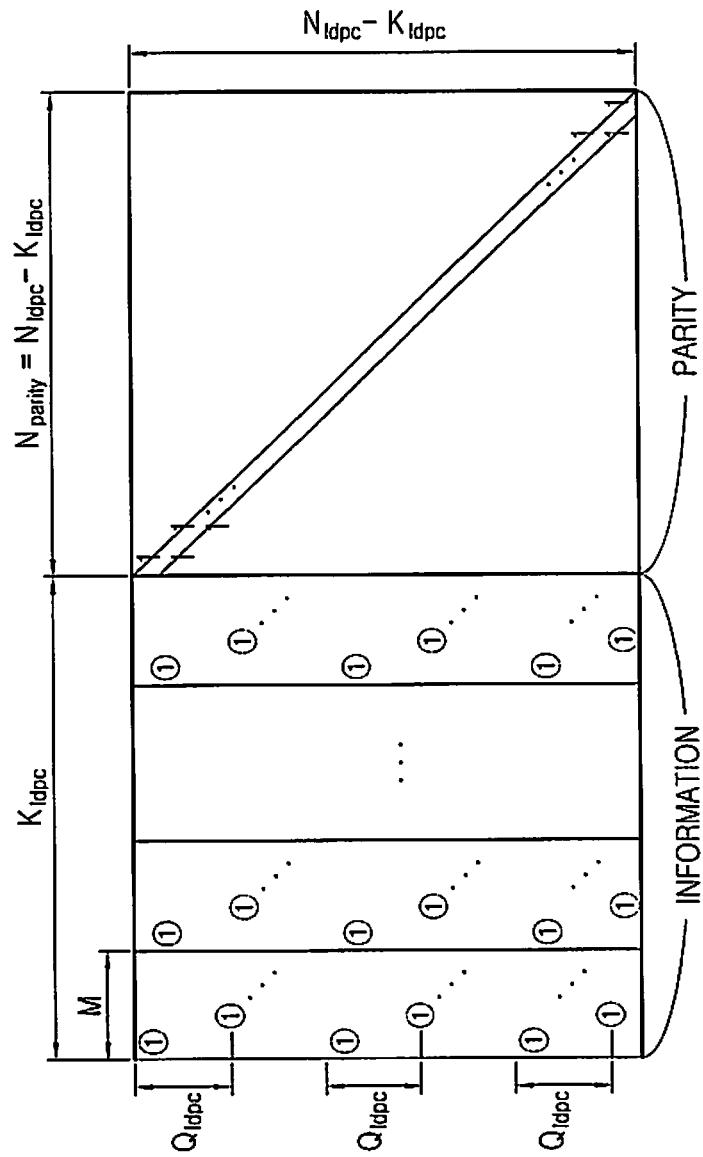
FIG. 3 illustrates a parity check matrix of an LDPC code used in a DVB-T2 system.
Figure 4:
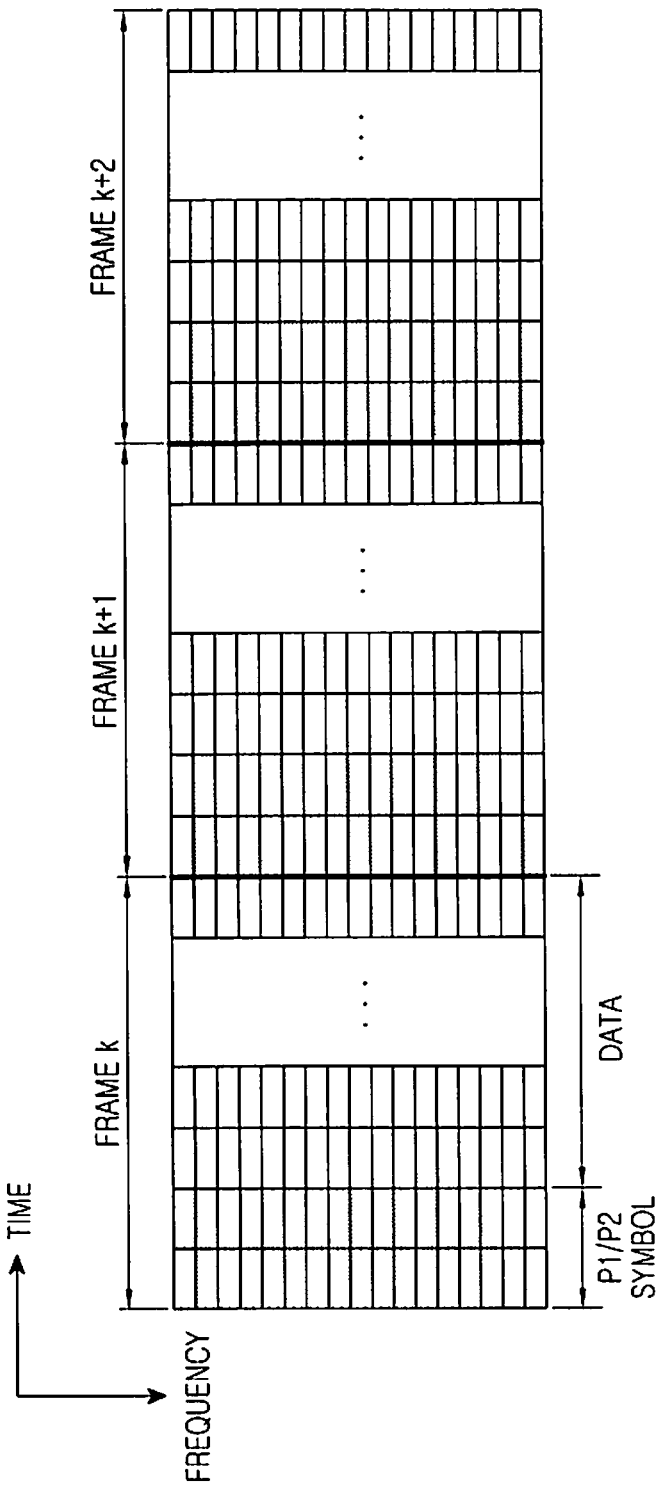
FIG. 4 illustrates a frame structure in a form for a DVB-T2/NGH system.

For the parity check matrix of an LDPC code illustrated in FIG. 3, having a codeword length of $N_{ldpc}$ and an information word length $K_{ldpc}$, the parity bits can be represented as $\{p_0, p_1, \ldots, p_{Nldpc-Kldpc-1}\}$ and $Q_{ldpc}$ groups of parity bits can be generated.

Figure 6:
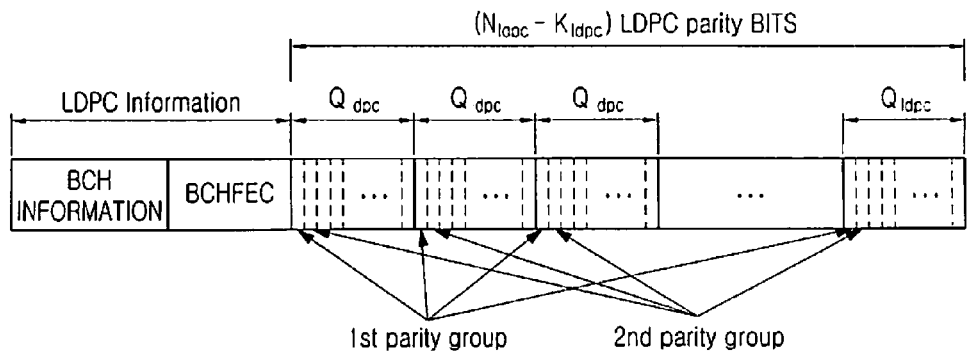
FIG. 6 illustrates parity bits included in $Q_{ldpc}$ groups according to an embodiment of the present invention.

FIG. 6 illustrates parity bits included in $Q_{ldpc}$ groups according to an embodiment of the present invention.

An index group representing index values of parity bits included in a j-th group from among the $Q_{ldpc}$ groups can be expressed as shown in Equation (3) below.

$$I(j)=\{k | k \bmod Q_{ldpc}=j, 0 \leq k < N_{ldpc}-K_{ldpc}\} \text{ for } 0 \leq j < Q_{ldpc} \qquad (3)$$

Based on Equation (3), an index group of parity bits for a puncturing pattern representing the puncturing order can be calculated as shown in Equation (4) below.

$$A_{360 \times j+i} = I_i(\pi_p(j)) \text{ for } 0 \leq i < 359, 0 \leq j < Q_{ldpc} \qquad (4)$$

That is, a (360×j+i)-th element in a puncturing pattern set A, which indicates a puncturing order, is the same as an i-th element in an I(π(j)) index group. π(j) for $0 \leq j < Q_{ldpc}$ is defined as Table 1 below.

ues belonging to an l-th group C(l) of indexes calculated in Equation (6), are included in an l-th group C(l) of additional parity bits.

TABLE 1

| Modulation and Code rate | | $\pi_P(0)$ $\pi_P(13)$ | $\pi_P(1)$ $\pi_P(14)$ | $\pi_P(2)$ $\pi_P(15)$ | $\pi_P(3)$ $\pi_P(16)$ | $\pi_P(4)$ $\pi_P(17)$ | $\pi_P(5)$ $\pi_P(18)$ | $\pi_P(6)$ $\pi_P(19)$ | $\pi_P(7)$ $\pi_P(20)$ | $\pi_P(8)$ $\pi_P(21)$ | $\pi_P(9)$ $\pi_P(22)$ | $\pi_P(10)$ $\pi_P(23)$ | $\pi_P(11)$ $\pi_P(24)$ | $\pi_P(12)$ — |
|---|---|---|---|---|---|---|---|---|---|---|---|---|---|---|
| BPSK/ QPSK | 1/2 | 6 22 | 4 12 | 18 3 | 9 16 | 13 23 | 8 1 | 15 14 | 20 0 | 5 21 | 17 19 | 2 7 | 24 11 | 10 — |
| 16-QAM | 1/2 | 6 7 | 4 12 | 13 1 | 9 16 | 18 23 | 8 14 | 15 0 | 20 21 | 5 10 | 17 19 | 2 11 | 22 3 | 24 — |
| 64-QAM | 1/2 | 6 24 | 15 7 | 13 18 | 10 1 | 3 12 | 17 20 | 21 0 | 8 4 | 5 14 | 19 9 | 2 11 | 23 22 | 16 — |

Table 1 may change, e.g., according to system requirements.

If the number of punctured bits is represented by $N_{punc}$ and the number of elements in a group l (for $0 \leq l < s$) is represented by $N_{add\_parity_l}$, an index group of parity bits in a group l (for $1 \leq l < s$) can be calculated using Equation (5) below.

$$C(l) = \{A_{N_{punc}+N_{add\_parity_0}+\ldots+N_{add\_parity_{l-1}}}, \ldots, A_{N_{punc}+N_{add\_parity_0}+\ldots+N_{add\_parity_l}-1}\} \quad (5)$$

$$C(l) = \left\{A_{N_{punc}+(N_{group_0}+\ldots+N_{group_{l_1}})}, A_{N_{punc}+(N_{group_0}+\ldots+N_{group_{l_1}}+1)}, \ldots, A_{N_{punc}+(N_{group_0}+N_{group_1}-1)}\right\} 1 \leq l < s$$

That is, $N_{add\_parity_l}$ indexes of parity bits included in an l-th group of additional parity bits are sequentially selected, except for indexes corresponding to punctured parity bits in the puncturing pattern set A.

Alternatively, indexes of parity bits included in a group of additional parity bits may be selected in a reverse order of the puncturing pattern. In this case, an index group of parity bits in a group l can be calculated using Equation (6) below.

$$C(0) = \{A_{N_{parity}-1}, A_{N_{parity}-2}, \ldots, A_{N_{parity}-N_{add\_parity_0}-1}\}$$

$$C(l) = \{A_{N_{parity}-(N_{add\_parity_0}+\ldots+N_{add\_parity_{l-1}})}, A_{N_{parity}-(N_{add\_parity_0}+\ldots+N_{add\_parity_{l-1}}-1)}, \ldots, A_{N_{parity}-(N_{add\_parity_0}+\ldots+N_{add\_parity_l}-1)}\} \quad (6)$$

$$1 \leq l < s$$

In Equation (6), $N_{parity}=N_{ldpc}-K_{ldpc}$ represents the number of parity bits.

That is, $N_{add\_parity_l}$ indexes of parity bits included in an l-th group of additional parity bits are selected in reverse order in the puncturing pattern set A indicative of puncturing order, starting with the last bit.

Based on the group of indexes calculated using Equation (5) or (6), elements in a group of parity bits transmitted over a plurality of frames can be expressed as shown in Equation (7) below.

$$G(l)=\{p_k | \forall k \in C(l)\} \text{ for } 0 \leq l < s \quad (7)$$

In Equation (7), $p_k$ represents a k-th parity bit in the parity check matrix. Using Equation (7), the parity bits having val- Accordingly, Equation (7) generates group satisfying Rule 3.

Rule 4

Additional parity bits are created based on parity bits and information bits by sequentially selecting parity bits and mapping them to groups $G(0), G(1), \ldots, G(s-1)$ in order. As for the information bits, information bits more likely to provide better performance are sequentially selected.

In creating additional parity bits according to Rule 4, an order of the additional parity bits to be created may also be determined from remaining bits, i.e., the non-punctured bits. However, after all the non-punctured bits are selected, the punctured bits may be selected.

In Rule 4, if additional parity bits should be selected, even after the punctured parity and non-punctured bits are all selected, bits more likely to provide better performance may be selected from information bits and parity bits using the greedy algorithm. The greedy algorithm is provided to select the best performance bits among codeword bits when primarily selecting additional parity bits, and select the best performance bits among the remaining bits, with the first selected bits fixed as previously selected bits, when secondarily selecting additional parity bits. The following should be considered in selecting high-performance bits.

1) Degrees of variable nodes corresponding to codeword bits

2) Minimum cycles of variable nodes corresponding to codeword bits

3) Bit Error Rate (BER) performance of codeword bits

In a parity check matrix with a parity part having a dual diagonal structure, because concatenated bits are connected to the same check nodes, there is a correlation between concatenated bits. Accordingly, it is preferable not to transmit the concatenated bits on the same channel. Thus, parity bits are mapped to different groups in sequence, in order to experience different channels.

Embodiment 3

Figure 7:
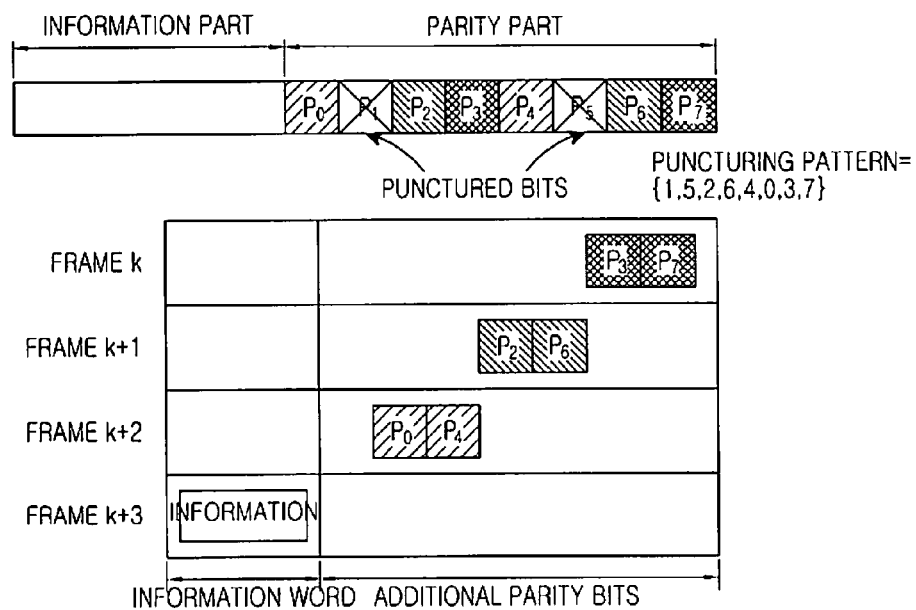
FIG. 7 illustrates a frame structure based on Rule 4 according to an embodiment of the present invention.

FIG. 7 illustrates a frame structure based on Rule 4 according to an embodiment of the present invention.

Referring to FIG. 7, a codeword includes an information part and a parity part. Using the same example as above, a length of the information part, after undergoing shortening, is 7 bits, I={$i_0, i_1, \ldots, i_6$}, the parity part is 8 bits in length, P={$p_0, p_1, p_2, \ldots, p_7$}, and a puncturing pattern set representing puncturing order is A={1, 5, 2, 6, 4, 0, 3, 7}.

For $N_{punc}=2$, s=3, and $N_{add\_parity_0}=N_{add\_parity_1}=N_{add\_parity_2}=2$ (where $N_{punc}$ is the number of punctured bits, s is the number of frames on which additional parity bits are transmitted, and $N_{add\_parity_0}$, $N_{add\_parity_1}$, and $N_{add\_parity_2}$ are the numbers of additional parity bits transmitted on their associated frames), groups of additional parity bits are created as described below. It is assumed that a parity check matrix corresponding to the parity part is a dual diagonal matrix in structure.

Because the number of punctured bits is 2, $p_1$ and $p_5$ are punctured according to the puncturing pattern set A.

Because parity bits are sequentially mapped to groups according to Rule 4, among the bits $p_0, p_2, p_3, p_4, p_6$, and $p_7$, i.e., the non-punctured parity bits, $p_0$ is mapped to a first group, $p_2$ to a second group, $p_3$ to a third group, $p_4$ to the first group, $p_6$ to the second group, and $p_7$ to the third group. As a result, the first group is G(0)={$p_0, p_4$}, the second group is G(1)={$p_2, p_6$}, and the third group is G(2)={$p_3, p_7$}. The first group is transmitted on a (k+2)-th frame, the second group on a (k+1)-th frame, and the third group on a k-th frame. While the determined groups are sequentially transmitted, transmission order of the groups is subject to change.

Embodiment 4

Again, a length of the information part, after undergoing shortening, is 7 bits, I={$i_0, i_1, \ldots, i_6$}, the parity part is 8 bits in length, P={$p_0, p_1, p_2, \ldots, p_7$}, and a puncturing pattern set representing puncturing order is A={1, 5, 2, 6, 4, 0, 3, 7}.

For $N_{punc}=2$, s=3, and $N_{add\_parity_0}=N_{add\_parity_1}=N_{add\_parity_3}=3$ (where $N_{punc}$ is the number of punctured bits, s is the number of frames on which additional parity bits are transmitted, and $N_{add\_parity_0}$, $N_{add\_parity_1}$, and $N_{add\_parity_2}$ are the numbers of additional parity bits transmitted on their associated frames), groups of additional parity bits are created as described below. It is assumed that a parity check matrix corresponding to the parity part is a dual diagonal matrix in structure.

Because the number of punctured bits is 2, $p_1$ and $p_5$ are punctured according to the puncturing pattern set A.

Because the number $N_{add\_parity_0}+N_{add\_parity_1}+N_{add\_parity_3}=9$ of additional parity bits forming groups is greater than the number of parity bits, i.e., 8, bits included in the last group are selected from the information bits. That is, a first group is G(0)={$p_0, p_4, p_1$}, a second group is G(1)={$p_2, p_6, p_5$}, and a third group is G(2)={$p_3, p_7, i_0$}.

The first group is transmitted on a (k+2)-th frame, the second group on a (k+1)-th frame, and the third group on a k-th frame. While the determined groups are sequentially transmitted, transmission order of the groups is subject to change.

A method for generating additional parity bits in accordance with another embodiment of the present invention will be described below.

By transmitting non-punctured parity bits and an information word on the same frame and transmitting additional parity bits on other frames to obtain an additional diversity gain, it is possible to obtain diversity gain while reducing the actual code rate.

For convenience of description, it is assumed herein that the term 'codeword' refers to all of an information word and parity bits obtained by encoding the information word. That is, the parity bits include both non-punctured parity bits and punctured parity bits.

Method 2

Non-punctured parity bits are transmitted on a z-th frame, which is the same frame as that of the information word, and additional parity bits obtained from information word and parity bits, which are included in groups G(0), G(1), . . . , G(s−1), according to specific rules, are transmitted over s frames.

The additional parity bits are bits that are transmitted on previous frames, instead of being transmitted on the same frame as that of the information words, aside from the parity bits that are transmitted on the same frames as those of the information words. G(0), G(1), . . . , G(s−1) represent groups of additional parity bits.

Rule 5

Additional parity bits are selected from parity bits and information bits, and the parity bits that are not transmitted on the same frames as the information bits are first selected. The parity bits that are not transmitted on the same frames the information bits are punctured parity bits. When additional parity bits are selected from parity bits, an order of selection of the additional parity bits is determined according to a normal order or a reverse order of a puncturing pattern. As to the information bits, information bits that are more likely to have a better performance are sequentially selected.

In creating additional parity bits according to Rule 5, parity bits that are not transmitted on the frames that information bits are transmitted, i.e., the punctured parity bits, are first selected as additional parity bits. After these parity bits that are all selected, information bits and parity bits from the codeword are selected as additional parity bits.

In Rule 5, if additional parity bits should be selected, after all of the punctured parity bits are selected all, bits that are more likely to provide better performance may be selected from the information bits and the parity bits of the codeword using the greedy algorithm. As described above, the greedy algorithm is provided to select the best performance bits among codeword bits when primarily selecting additional parity bits, and select the best performance bits among the remaining bits, with the first selected bits fixed as previously selected bits, when secondarily selecting additional parity bits, and considers the following in selecting high-performance bits.

1) Degrees of variable nodes corresponding to codeword bits

2) Minimum cycles of variable nodes corresponding to codeword bits

3) BER performance of codeword bits

Embodiment 5

Figure 8A:
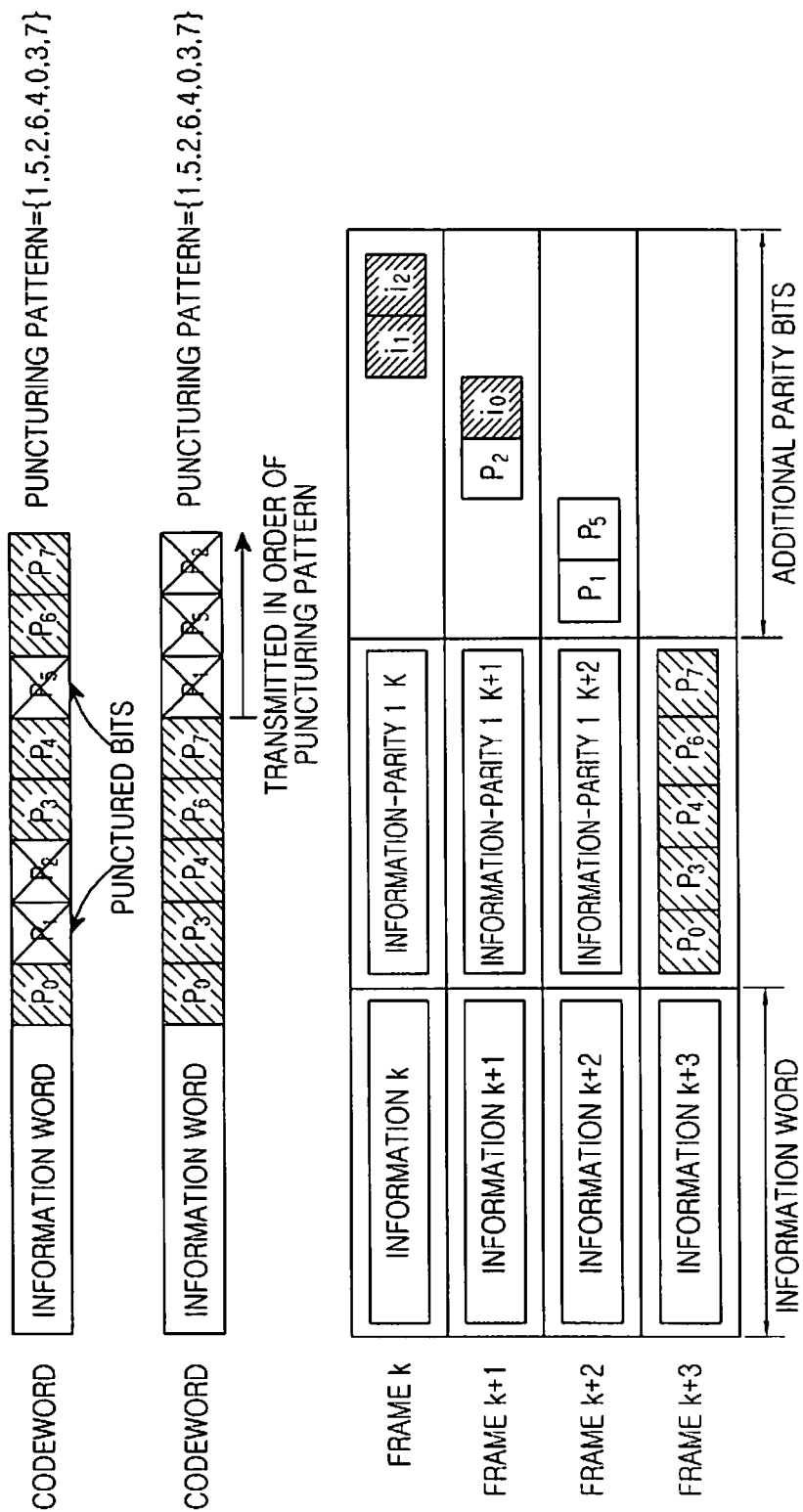
FIGS. 8A to 8C illustrate frame structures based on Rule 5 according to an embodiment of the present invention.
Figure 8B:
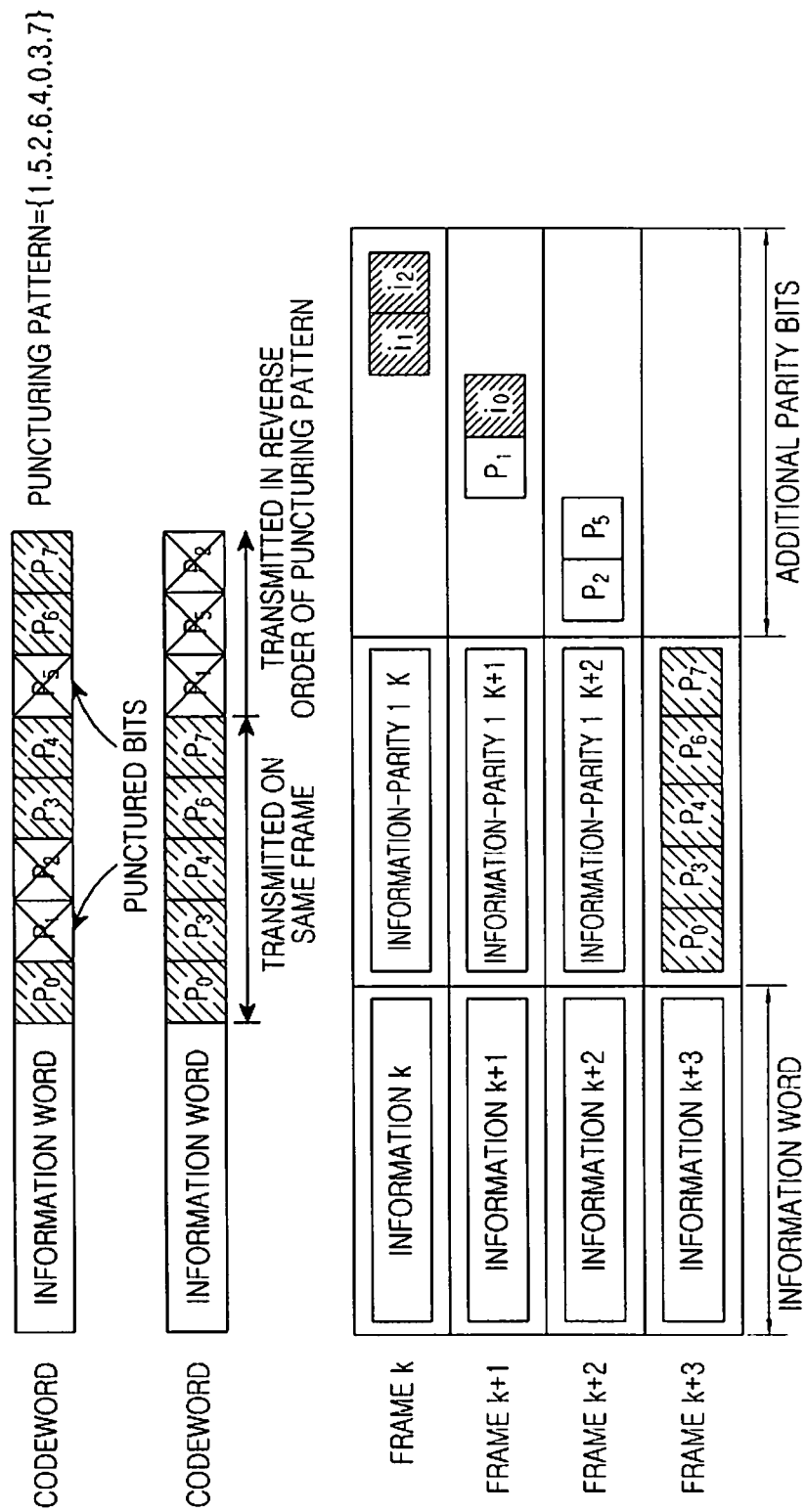
Figure 8C:
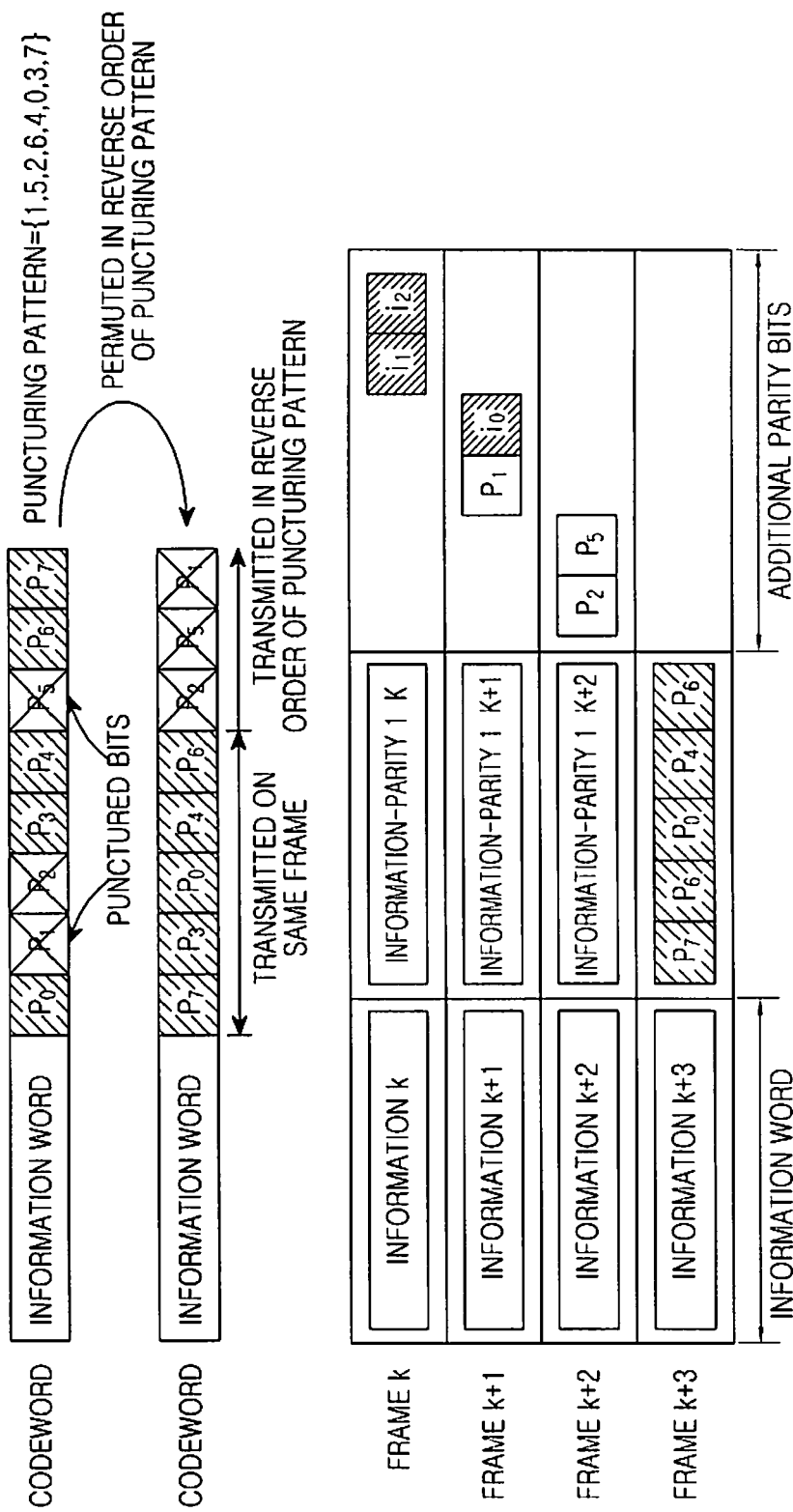

FIGS. 8A to 8C illustrate frame structures based on Rule 5 according to an embodiment of the present invention.

Referring to FIG. 8A, a codeword includes an information part and a parity part. A length of the information part, after undergoing shortening, is 7 bits, I={$i_0, i_1, \ldots, i_6$}, the parity part is 8 bits in length, P={$p_0, p_1, p_2, \ldots, p_7$}, and a puncturing pattern set representing puncturing order is A={1, 5, 2, 6, 4, 0, 3, 7}.

If the number of parity bits transmitted on the same frames as those of information bits is 5, for $N_{punc}=3$, s=3, and $N_{add\_parity_0}=N_{add\_parity_1}=N_{add\_parity_2}=2$ (where $N_{punc}$ is the number of punctured bits, s is the number of frames on which additional parity bits are transmitted, and $N_{add\_parity_0}$, $N_{add\_parity_1}$, and $N_{add\_parity_2}$ are the numbers of additional parity bits transmitted on their associated frames), groups of additional parity bits are created as described below.

Because $N_{punc}=3$, $p_1$, $p_5$, and $p_2$ are punctured, and parity bits transmitted on the same frames as those of information bits are $p_0$, $p_3$, $p_4$, $p_6$, and $p_7$.

In mapping bits to groups in a puncturing order according to Rule 5, a first group $G(0)=\{p_1, p_5\}$ is created by selecting parity bits p1 and $p_5$, which have first and second elements of 1 and 5 in the puncturing pattern as their index values. For a second group, a parity bit $p_2$ having a third element of 2 in the puncturing pattern as its index is selected. Because all of the punctured parity bits are selected, the second group is created by selecting one of the information bits and the non-punctured parity bits. If a first information bit is selected, the second group is $G(1)=\{p_2, i_0\}$. If $i_1$ and $i_2$ are selected from among information bits and non-punctured parity bits to create a third group, the third group is $G(2)=\{i_1, i_2\}$. The first group is transmitted on a (k+2)-th frame, the second group on a (k+1)-th frame, and the third group on a k-th frame.

Referring to FIG. 8B, if bits are mapped to groups in a reverse order of the puncturing pattern, a first group $G(0)=\{p_2, p_5\}$, a second group $G(1)=\{p_1, i_0\}$, and a third group $G(2)=\{i_1, i_2\}$ are created by selecting bits from among the punctured parity bits $\{p_1, p_5, p_2\}$ among elements in the puncturing pattern set A, starting with the last bit. The first group is transmitted on a (k+2)-th frame, the second group on a (k+1)-th frame, and the third group on a k-th frame.

Referring to FIG. 8C, to facilitate easy selection of parity bits transmitted on frames, parity bits are sequentially transmitted in a reverse order of the puncturing pattern, after undergoing permutation. That is, because the puncturing pattern is $A=\{1, 5, 2, 6, 4, 0, 3, 7\}$, parity bits are arranged as $p_7$, $p_3$, $p_0$, $p_4$, $p_6$, $p_2$, $p_5$, and $p_1$ in reverse order of the puncturing pattern, and parity bits transmitted on the same frames as those of the information bits are $p_7$, $p_3$, $p_0$, $p_4$, and $p_6$, because five bits are sequentially selected from the arranged parity bits. Thus, for $G(0)$, $p_2$ and $p_5$ are selected. For $G(1)$, $p_1$ is selected and one bit is selected from the information bits. For $G(2)$, two bits are selected from the information bits according to the greedy algorithm.

While the determined groups are sequentially transmitted, the transmission order of the groups is subject to change.

Embodiment 6

A length of the information part, after undergoing shortening, is 7 bits, $I=\{i_0, i_1, \ldots, i_6\}$, the parity part is 8 bits in length, $P=\{p_0, p_1, p_2, \ldots, p_7\}$, and a puncturing pattern set representing puncturing order is $A=\{1, 5, 2, 6, 4, 0, 3, 7\}$.

For $N_{punc}=3$, $s=3$, and $N_{add\_parity_0}=N_{add\_parity_1}=N_{add\_parity_2}=4$ (where $N_{punc}$ is the number of punctured bits, s is the number of frames on which additional parity bits are transmitted, and $N_{add\_parity_0}$, $N_{add\_parity_1}$, and $N_{add\_parity_2}$ are the numbers of additional parity bits transmitted on their associated frames), groups of additional parity bits are created as described below.

Because $N_{punc}=3$, $p_1$, $p_5$, and $p_2$ are punctured, and $p_0$, $p_3$, $p_4$, $p_6$, and $p_7$ are the parity bits transmitted on the same frames as those of information bits.

By mapping the remaining parity bits, i.e., the punctured parity bits, to groups in puncturing order according to Rule 5, a first group is $G(0)=\{p_1, p_5, p_2, i_0\}$, a second group is $G(1)=\{i_1, i_2, i_3, i_4\}$ and a third group is $G(2)=\{i_5, i_6, p_6, p_4\}$. In creating the third group $G(2)$, because the parity bits are arranged as $i_1$, $i_5$, $p_2$, $p_6$, $i_4$, $i_0$, $p_3$, and $p_7$ according to the puncturing pattern, and among them, $i_1$, $i_5$, and $p_2$ were selected for the first group $G(0)$, then $p_6$, and $i_4$ are selected for the third group $G(2)$.

By mapping the punctured parity bits to groups in a reverse puncturing order, a first group is $G(0)=\{p_2, p_5, p_1, i_0\}$, a second group is $G(1)=\{i_1, i_2, i_3, i_4\}$, and a third group is $G(2)=\{i_5, i_6, p_7, p_3\}$. In creating the third group $G(2)$, because the parity bits are arranged as $i_7$, $i_3$, $p_0$, $p_4$, $i_6$, $i_2$, $p_5$, and $p_1$ in reverse order of the puncturing pattern, and among them, $i_2$, $i_5$, and $p_1$ were selected for the first group $G(0)$, then $p_7$ and $i_3$, which are first and second parity bits among the parity bits arranged in reverse puncturing order, are selected for the third group $G(2)$.

The first group is transmitted on a (k+2)-th frame, the second group is transmitted on a (k+1)-th frame, and the third group is transmitted on a k-th frame.

While the determined groups are sequentially transmitted, the transmission order of the groups is subject to change. In addition, various other methods for selecting information bits are available in different embodiments of the present invention.

A method for creating additional parity bits when encoding and decoding are performed based on the parity check matrixes used in Digital Video Broadcasting the 2nd Generation Satellite (DVB-S2), DVB-T2, Digital Video Broadcasting the 2nd Generation Cable (DVB-C2), and DVB-NGH systems will be described below.

In the following description, it is assumed that a code rate of a parity check matrix is R=4/9, the number of information bits is $K_{ldpc}=7200$, the number of codeword bits is $N_{ldpc}=16200$, and the number of parity bits is $N_{parity}=N_{ldpc}-K_{ldpc}=9000$.

As described above, for an information part of an LDPC code, blocks are generated on a 360-column basis. In a parity check matrix, a total of 20 column groups are generated by grouping 7200 columns corresponding to an information word on a 360-column basis. A parity part may express $Q_{ldpc}$ groups, each of which includes 360 elements as shown in Equation (2) and represents indexes of parity bits. For a code rate R of 4/9, $Q_{ldpc}=25$. In addition, any of the puncturing patterns in Table 1 may be used.

For convenience of description, sets of indexes included in column groups of an information part can be expressed as shown in Equation (8) below.

$$X(j) = \left\{ k \,\middle|\, \left[\frac{k}{360}\right] = j, \ 0 \le k < K_{bch} \right\} \text{ for } 0 \le j < N_{info} \quad (8)$$

In Equation (8), [k/360] indicates an integer less than k/360. For example, if k/360=0.2, [0.2]=0, or if k/360=11.8, [11.8]=11. In addition, $N_{info}$ indicates the number of column groups in the information part, and $N_{info}=20$ for R=4/9. Additionally, $K_{bch}$ indicates the number of information bits of a BCH code, when an LDPC code and a BCH code are used by being concatenated.

An order for creating optimal additional parity bits according to a length will be described below. The following description assumes that additional parity bits can be selected from parity bits in a reverse order of puncturing.

If the number of input information word is 7200, additional parity bits are first selected in a reverse order of puncturing, because puncturing and shortening are not required. That is, by selecting index values in the following order, information bits and parity bits corresponding to the index values are selected. In the following description, I(a) indicates a set of indexes of parity bits as defined in Equation (3), and X(a) indicates a set of indexes of information bits as defined in Equation (8). In other words, I(a) indicates that parity bits having elements of I(a) are selected as their indexes, and X(a) indicates that information bits having elements of X(a) are selected as their indexes.

I(11)→I(7)→I(19)→I(21)→I(0)→I(14)→I(1)→I(23)→I(16)→I(3)→I(12)→I(22)→I(10)→I(24)→I(2)→I(17)→I(5)→I(20)→I(15)→I(8)→I(13)→I(9)→I(18)→I(4)→I(6)

I(9)→I(26)→I(3)→I(15)→I(30)→I(13)→I(6)→I(19)→I(34)→I(16)→I(1)→I(23)→I(4)→I(17)→I(22)→I(24)→I(7)→I(11)→I(31)→I(10)→I(8)→I(2)→I(35)→I(28)→I(20)→I(18)→I(25)→I(33)→I(0)→I(21)→I(12)→I(5)→I(32)→I(29)→I(14)→I(27)

When more additional parity bits are required, bits are selected in the following order.

I(11)→I(7)→I(19)→I(21)→I(0)→I(14)→I(1)→I(23)→I(16)→I(3)→I(12)→I(22)→I(10)→I(24)→I(2)→I(17)→I(5)→I(20)→I(15)→I(8)→I(13)→I(9)→I(18)→I(4)→I(6)→ X(5)→X(6)→X(7)→X(8)→X(9)→X(10)→X(11)→X(12)→X(13)→X(14)→X(15)→X(16)→X(17)→X(18)→X(19)→X(0)→X(1)→X(2)→X(3)→X(4)

X(4)→X(5)→I(9)→I(26)→X(6)→X(7)→X(8)→I(3)→I(15)→I(30)→I(13)→I(6)→I(19)→I(34)→I(16)→I(1)→I(23)→I(4)→I(17)→I(22)→I(24)→I(7)→I(11)→I(31)→I(10)→I(8)→I(2)→I(35)→I(28)→I(20)→I(18)→I(25)→I(33)→I(0)→I(21)→I(12)→I(5)→I(32)→I(29)→I(14)→I(27)

Thereafter, if even more additional parity bits are required, both of the above transmission orders are repeated in the same way.

As another example, if the number of input information word is 3600, 10 information bocks undergo shortening and 12 parity blocks undergo puncturing. As a result, the number of non-punctured blocks is 25−12=13, and non-punctured blocks are first selected in the following order.

I(11)→I(7)→I(19)→I(21)→I(0)→I(14)→I(1)→I(23)→I(16)→I(3)→I(12)→I(22)→I(10)

I(9)→I(26)→I(3)→I(15)→I(30)→I(13)→I(6)→I(19)→I(34)→I(16)→I(1)→I(23)→I(4)→I(17)→I(22)→I(24)→I(7)→I(11)→I(31)→I(10)→I(8)→I(2)→I(35)→I(28)→I(20)→I(18)→I(25)→I(33)→I(0)

If more additional parity bits are required, bits are selected in the following order.

X(5)→X(6)→X(7)→X(8)→X(9)→X(19)→X(0)→X(1)→ I(11)→I(7)→X(2)→X(3)→I(19)→I(21)→I(0)→I(14)→ I(1)→I(23)→I(16)→I(3)→I(12)→I(22)→I(10)→I(24)→ I(2)→I(17)→I(5)→I(20)→I(15)→I(8)→I(13)→I(9)→ I(18)→ I(4)→I(6)

I(21)→I(12)→I(5)→I(32)→I(29)→I(14)→I(27)→X(4→X(5→X(6)→I(9)→X(8)→I(26)→I(3)→I(15)→I(30)→ I(13)→I(6)→I(19)→X(4)→I(34)→I(16)→I(1)→I(23)→ I(4)→I(17)→I(22)→I(24)→I(7)→X(5) I(11)→I(31)→ I(10)→I(8)→X(6)→I(2)→I(35)→I(28)→I(20)→I(18)→ I(25)→I(33)→I(0)→I(21)→I(12)→I(5)→I(32)→I(29)→ I(14)→I(27)

Thereafter, if even more additional parity bits are required, bits are repeatedly transmitted starting with codeword bits.

As is apparent from the foregoing description, the order of selecting additional parity bits having an optimal performance may be difference according to the length of input information bits. However, if bits are selected as will be described below, optimal performance and optimal system efficiency may be achieved.

More specifically, because Method 1 does not transmit parity bits on the same frames as those of information bits, additional parity bits may be selected in the following order.

1) Non-punctured parity bits are selected in a normal order or a reverse order of the puncturing pattern.

2) If more additional parity bits are required, punctured parity bits are selected in the normal order or the reverse order of the puncturing pattern.

3) If more additional parity bits are still required, bits are selected starting with information bits with a degree of 3.

4) If even more additional parity bits are still required, parity bits are selected in the normal order or the reverse order of the puncturing pattern.

5) If more additional parity bits are required, information bits with a degree of 12 are selected.

6) If more additional parity bits are required, the procedure above is repeated from step 1).

In accordance with another embodiment of the present invention, additional parity bits may be selected in the following order.

1) Non-punctured parity bits are selected in a normal order or a reverse order of the puncturing pattern.

2) If more additional parity bits are required, punctured parity bits are selected in the normal order or the reverse order of the puncturing pattern.

3) If more additional parity bits are still required, bits are selected starting with information bits with a degree of 3.

4) If even more additional parity bits are still required, information bits with a degree of 12 are selected.

5) If more additional parity bits are required, parity bits are selected in the normal order or the reverse order of the puncturing pattern.

6) If more additional parity bits are required, the procedure above is repeated from step 1).

In accordance with another embodiment of the present invention, additional parity bits may be selected in the following order.

1) Non-punctured parity bits are selected in a normal order or a reverse order of the puncturing pattern.

2) If more additional parity bits are required, punctured parity bits are selected in the normal order or the reverse order of the puncturing pattern.

3) If more additional parity bits are still required, parity bits are selected in the normal order or the reverse order of the puncturing pattern.

4) If even more additional parity bits are still required, bits are selected starting with information bits with a degree of 12.

5) If more additional parity bits are required, information bits with a degree of 2 are selected.

6) If more additional parity bits are required, the procedure above is repeated from step 1).

Because Method 2, as described above, transmits parity bits on the same frames as those of information bits, non-punctured parity bits are transmitted on the same frames as those of information bits.

Therefore, in accordance with an embodiment of the present invention, additional parity bits are selected in the following order.

1) If additional parity bits are required, punctured parity bits are selected in a normal order or a reverse order of the puncturing pattern.

2) If more additional parity bits are required, bits are selected starting with information bits with a degree of 3.

3) If more additional parity bits are still required, parity bits are selected in the normal order or the reverse order of the puncturing pattern.

4) If even more additional parity bits are still required, information bits with a degree of 12 are selected.

5) If more additional parity bits are required, non-punctured parity bits are selected in the normal order or the reverse order of the puncturing pattern.

6) If more additional parity bits are required, the above is repeated from 1).

In accordance with another embodiment of the present invention, additional parity bits may be selected in the following order.

1) If additional parity bits are required, punctured parity bits are selected in a normal order or a reverse order of the puncturing pattern.

2) If more additional parity bits are required, bits are selected starting with information bits with a degree of 3.

3) If more additional parity bits are still required, information bits with a degree of 12 are selected.

4) If even more additional parity bits are still required, punctured parity bits and non-punctured parity bits are selected in the normal order or the reverse order of the puncturing pattern.

5) If more additional parity bits are required, the procedure above is repeated from step 1).

In accordance with another embodiment of the present invention, additional parity bits may be selected in the following order.

1) If additional parity bits are required, punctured parity bits are selected in a normal order or a reverse order of the puncturing pattern.

2) If more additional parity bits are required, parity bits are selected in the normal order or the reverse order of the puncturing pattern.

3) If more additional parity bits are still required, bits are selected starting with information bits with a degree of 3.

4) If even more additional parity bits are still required, information bits with a degree of 12 are selected.

5) If more additional parity bits are required, the procedure above is repeated from step 1).

While methods above have been described based on a code with a code rate of ½, among LDPC codes used in DVB-S2, DVB-T2, DVB-C2, and DVB-NGH systems, the same methods may be applied to other code rates.

Figure 9:
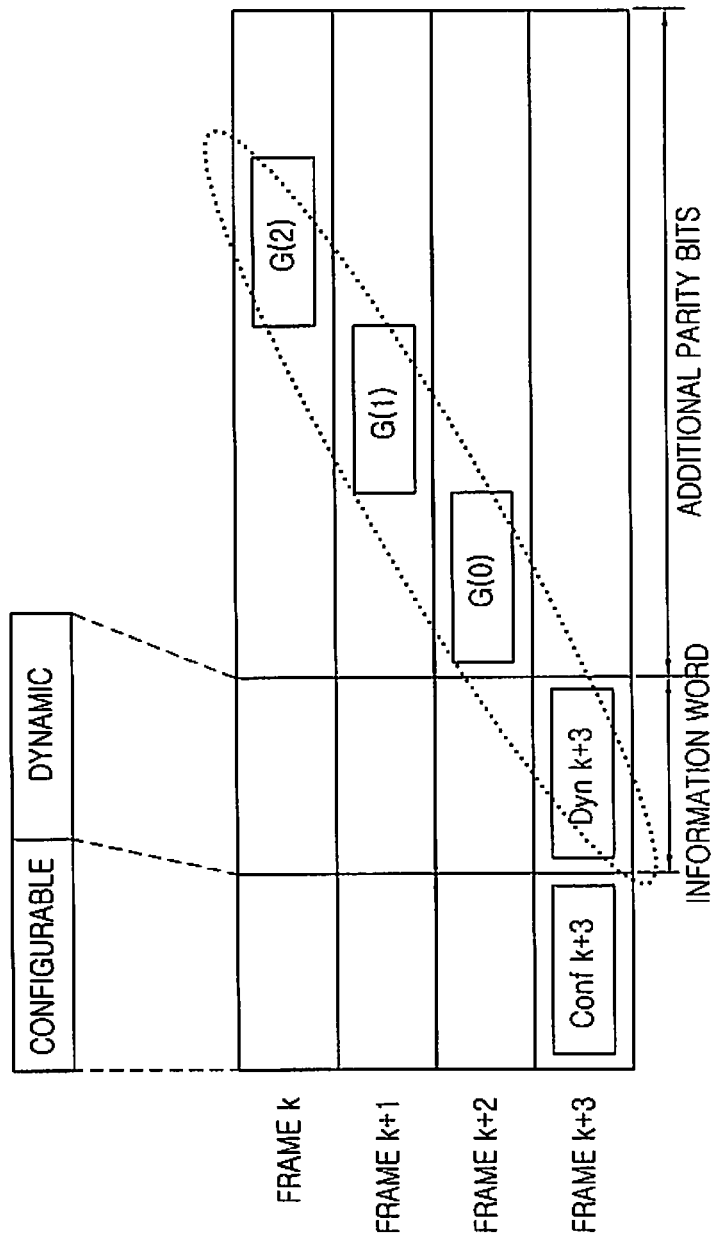
FIG. 9 illustrates a frame structure of a DVB-T2/NGH system according to an embodiment of the present invention.

FIG. 9 illustrates a frame structure of a DVB-T2/NGH system according to an embodiment of the present invention.

Referring to FIG. 9, the signaling information word used in the DVB-T2/NGH system includes a configurable information part and a dynamic information part. The configure information part includes information that remains unchanged for several frames, whereas the dynamic information part includes information that changes for each frame. It is important to receive the configure information part and the dynamic information part without error, because they include information about data of the current frame. For example, when a Cyclic Redundancy Check (CRC) error occurs, data information of the pertinent frame may not be received.

In the configure information part, because the same information is received over several frames, if the received information is stored, errors may be corrected by obtaining diversity gain using the stored information. However, because the dynamic information part, is not repeatedly transmitted, sufficient diversity gain may not be obtained and significant deterioration of error correction capability may occur.

Therefore, as illustrated in FIG. 9, additional parity bits are transmitted on a plurality of frames by applying Method 1, as described above, to the dynamic information part. That is, additional parity bits are created after encoding the dynamic information part by a specific method, and the additional parity bits are divided into a plurality of groups $G(0)$, $G(1), \ldots, G(s-1)$ whose numbers of elements are $N_{add\_parity_0}$, $N_{add\_parity_1}, \ldots, N_{add\_parity_{s-1}}$, and transmitted on s frames. While s=3 in FIG. 9, it is obvious that s can be determined at random. Bits in each group are transmitted on the same frame. Rules 3 and 4 may be applied to the method of dividing parity bits into a plurality of groups. While $G(0), G(1), \ldots, G(s-1)$ are sequentially mapped to frames in FIG. 9, the method of mapping groups to frames is subject to change.

An occurrence of an error in the signaling information may be detected through a CRC check. If an error is detected through the CRC check, $G(0), G(1), \ldots, G(s-1)$ are received and dynamic information undergoes additional decoding. After the decoding operation is performed, a CRC check on the signaling may be performed once again to determine whether or nor there is an error.

If an error occurs in additional parity bits in the signaling information parts, the CRC check error may continuously occur, even though dynamic information is recovered through the additional decoding. To resolve these problems, an additional CRC may be used in dynamic information.

Figure 10:
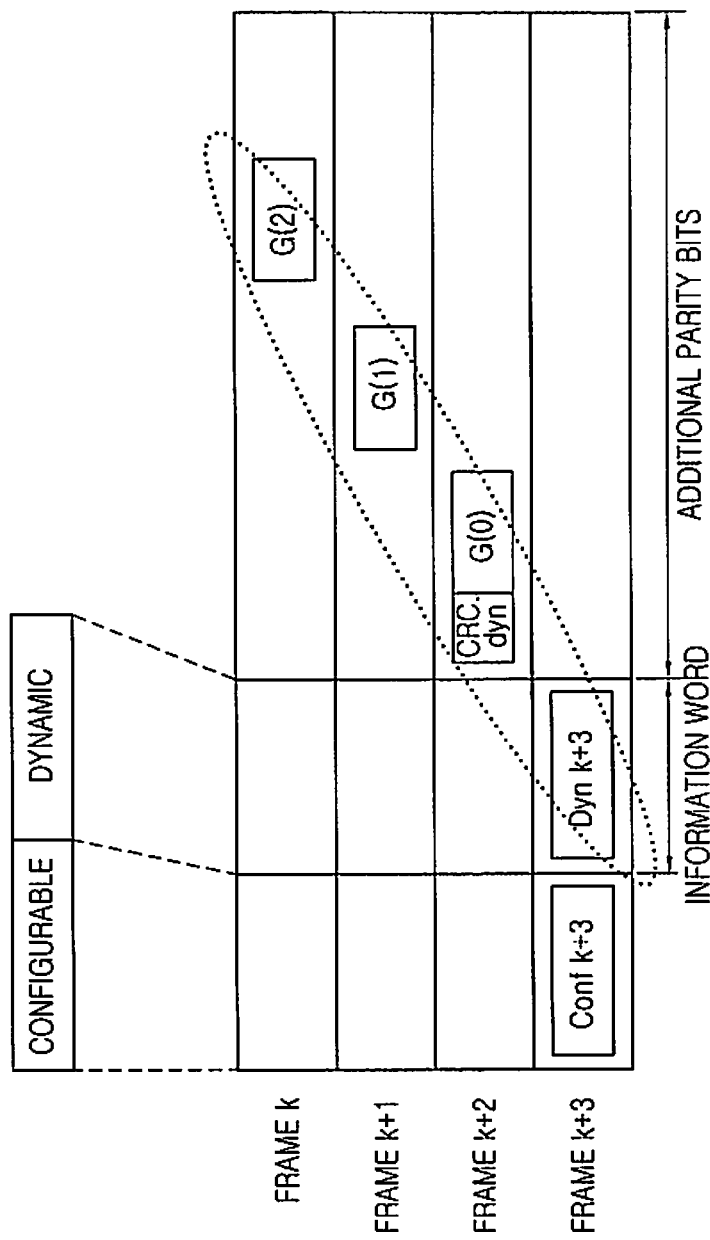
FIG. 10 illustrates a frame structure of a DVB-T2/NGH system according to another embodiment of the present invention.

FIG. 10 illustrates a frame structure in which an additional CRC is used for dynamic information. Specifically, FIG. 10 illustrates a frame structure of a DVB-T2/NGH system according to another embodiment of the present invention.

If dynamic information is transmitted on a (k+3)-th frame, a CRC for the dynamic information may be transmitted on one of the frames over which additional parity bits are transmitted. As illustrated in FIG. 10, the CRC is transmitted on a (k+2)-th frame. When the dynamic information is encoded in the above method, a CRC may be included or not included in the information word.

In the DVB-T2/NGH system, signaling information, including configurable information, dynamic information, an extension part, a CRC, and padding bits, is encoded as an information word.

In accordance with an embodiment of the present invention, when information is transmitted as illustrated in FIGS. 9 and 10, a transmitter performs additional encoding on the dynamic information, and a receiver performs an additional decoding process on the dynamic information, when a CRC error for the signaling information occurs. In addition, if puncturing and shortening patterns for encoding of dynamic information are different from puncturing and shortening patterns for signaling, an additional module may be required for encoding and decoding of the dynamic information.

Using the frame structures as illustrated in FIGS. 9 and 10, encoding and decoding is performed twice for the signaling information. That is, signaling is divided into two different types of information: one is configure (conf) information that does not vary every frame, and another is dynamic (dyn) information that varies every frame. These two types of information are input as one information word and encoded. Of them, only the dyn information is separately encoded, and its parity bits are transmitted in previous frames. Therefore, primarily, conf and dyn are input as an information word and encoded, and secondarily, dyn is input and encoded. However, by using Method 2, encoding may be performed only once, and because additional puncturing and shortening patterns are not required, the additional module may be minimized in the encoding and decoding process.

Figure 11:
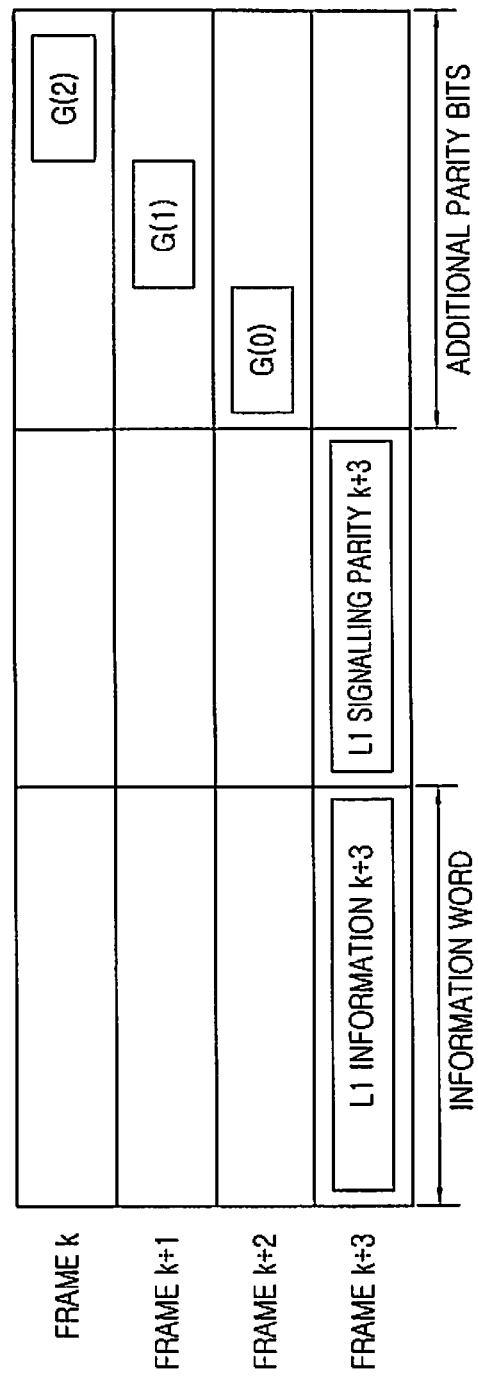
FIG. 11 illustrates a frame structure of a DVB-T2/NGH system according to another embodiment of the present invention.

FIG. 11 illustrates a frame structure of a DVB-T2/NGH system according to another embodiment of the present invention. Specifically, FIG. 11 illustrates Method 2, as described above, applied to a DVB-T2/NGH system.

The configurable information and dynamic information are received and LDPC-encoded. Generally, because signaling is variable, it undergoes shortening and puncturing to be adaptively encoded according to the variable length.

In the NGH system, because configurable information and dynamic information are encoded independently, L1 signaling in FIG. 11 refers to all kinds of L1 signaling information, instead of being limited to the configurable and dynamic information.

Non-punctured parity bits are transmitted on a (k+3)-th frame, which is the same frame as that of the signaling bits of FIG. 11. Groups G(0), G(1), and G(2) of additional parity bits, which are calculated by Rule 5 and whose numbers of elements are $N_{add\_parity_0}$, $N_{add\_parity_1}$, and $N_{add\_parity_2}$, are transmitted on a (k+2)-th frame, a (k+1)-th frame, and a k-th frame, respectively.

While the number of frames on which additional parity bits are transmitted is assumed to be 3 in FIG. 11, as mentioned above, other numbers of frames may be used. Also, positions of the groups G(0), G(1), and G(2) of additional parity bits are changeable. That is, the additional parity bits may be transmitted on P1/P2 symbols, or an auxiliary stream. Also, the additional parity bits may be transmitted using the general data stream.

While the additional parity bits are transmitted on a (k+2)-th frame, a (k+1)-th frame, and a k-th frame, i.e., subsequent frames, in the descriptions above, alternatively, the additional parity bits may be transmitted on s previous frames.

Figure 22A:
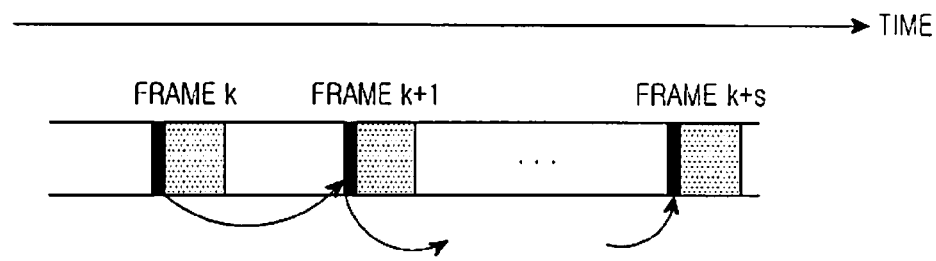
FIGS. 22A and 22B are diagrams illustrating various frame structures according to different embodiments of the present invention.
Figure 22B:
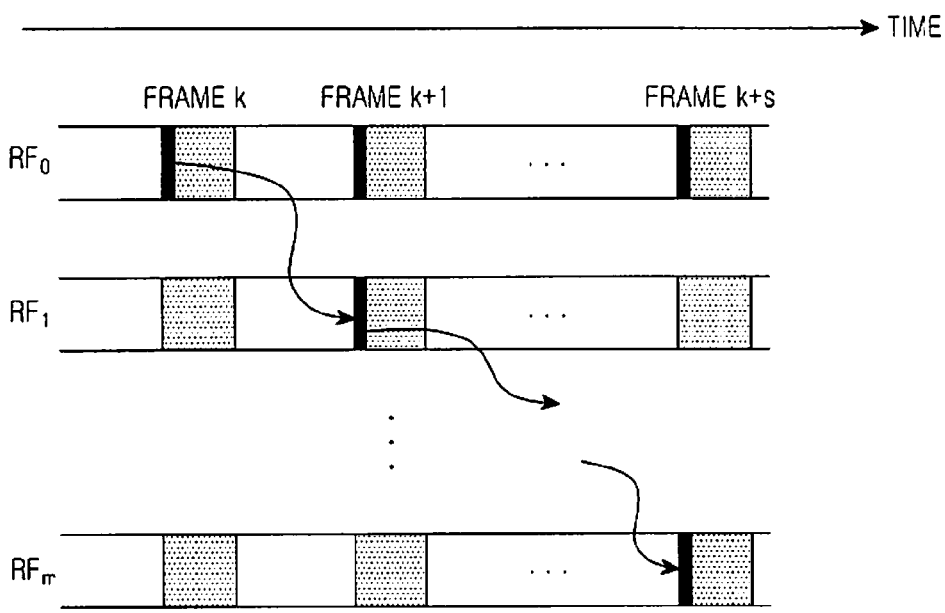

FIGS. 22A and 22B are diagrams illustrating various frame structures according to different embodiments of the present invention. Specifically, FIGS. 22A and 22B illustrate frames structures in which additional parity bits are transmitted on s previous frames.

FIG. 22A illustrates additional parity bits being transmitted on frames preceding concatenated frames. For example, in the DVB-NGH system, NGH frames are transmitted using Future Extension Frames (FEF) in DVB-T2. Accordingly, the various embodiments of the present invention are not limited to the transmission of additional parity bits on s concatenated frames, and may be applied to the transmission on s frames preceding the frames carrying information bits.

FIG. 22B illustrates that additional parity bits may be transmitted in other RF bands. That is, in accordance with an embodiment of the present invention, the additional parity bits are not limited to the frames transmitted in the same RF channel.

Signaling used in a DVB-T2 system is classified into two types: L1 pre-signaling and L1 post-signaling including a configurable part, a dynamic part, and an extension part. While Method 2 has been described based on L1 post-signaling of T2 type signaling in FIG. 2, it may be applied to L1 pre-signaling of another type, e.g., DVB-NGH.

As in Method 2, after signaling information is encoded, non-punctured parity bits are transmitted on the same frames as those of information bits, and additional parity bits including information bits and parity bits are transmitted on previous frames. For the additional parity bits, punctured parity bits are first selected, and these bits are selected in a normal order or a reverse order of the puncturing pattern.

$(N_{ldpc} - K_{ldpc})$ parity bits can be divided into $Q_{ldpc}$ groups, and a j-th parity group $P_j$ can be expressed as shown in Equation (9).

$$P_j = \{p_k | k \bmod Q_{ldpc} = j, 0 \le k < N_{ldpc} - K_{ldpc}\} \text{ for } 0 \le j < Q_{ldpc} \quad (9)$$

Using Equation (10) below, $Q_{ldpc}$ can be calculated based on M, $N_{ldpc}$ and $K_{ldpc}$ as illustrated in FIG. 3.

$$Q_{ldpc} = (N_{ldpc} - K_{ldpc})/M \quad (10)$$

In Equation (10), parity bits are divided into $Q_{ldpc}$ groups, and each group includes M bits.

For a given number $N_{punc}$ of punctured bits, punctured parity bits may be calculated as described below in Steps 1-3.

Step 1: The number $N_{punc\_group}$ of groups whose all parity bits are punctured can be calculated using Equation (11) below, wherein an operator $\lfloor a \rfloor$ indicates a maximum integer not exceeding a. For example, $\lfloor 1.1 \rfloor = 1$, and $\lfloor 4.5 \rfloor = 4$.

$$N_{punc\_group} = \left\lfloor \frac{N_{punc}}{M} \right\rfloor \text{ for } 0 \le N_{punc} < N_{ldpc} - K_{ldpc} \quad (11)$$

Step 2: For $N_{punc\_group}$ parity bit groups $$P_{\pi_p(0)}, P_{\pi_p(1)}, \ldots, P_{\pi_p(N_{punc\_group}-1)},$$

all parity bits in the groups are punctured. $\pi_p(j)$, which represents an index of a parity group, also indicates a puncturing order, e.g., as defined in Table 1. For example, in BPSK modulation, since $\pi_p(0)$ is 6, parity bits in a parity bit group $P_{\pi_p(0)} = P_6$ are first punctured.

Step 3: For a group $$P_{\pi_p(N_{punc\_group})}, (N_{punc} - M \times N_{punc\_group})$$

bits are punctured starting with first parity bits in the group. Non-punctured parity bits are transmitted on the same frames as those of the information bits.

Embodiment 7

A group G(0) of first additional parity bits is calculated as described below. For convenience of description, the description assumes that the method is performed starting with Step 4) below, after already performing Steps 1 to 3, described above.

Step 4: The number of parity bit groups whose all elements are selected to select additional parity bits, is calculated using Equation (12).

$$N_{add\_parity_0\_group} = \left\lfloor \frac{N_{add\_parity_0}}{M} \right\rfloor \quad (12)$$

In Equation (12), $N_{add\_parity_0}$ indicates the number of first additional parity bits.

Step 5: For $N_{add\_parity_0\_group}$ parity bit groups $$P_{\pi_p(0)}, P_{\pi_p(1)}, \ldots, P_{\pi_p(N_{add\_parity_0\_group}-1)},$$

all parity bits in the groups are included in a group G(0) of first additional parity bits, and are transmitted on frames preceding the frame over which the information bits are transmitted.

The preceding frames may be applied even in other RF channels as described above in connection with FIG. 22.

Step 6: For a group $$P_{\pi_p(N_{add\_parity_0\_group})}, (N_{add\_parity_0} - M \times N_{add\_parity_0\_group})$$

parity bits are included in a group G(0) of first additional parity bits, starting with first parity bits in the group.

Figures 12A, 12B, 12C:
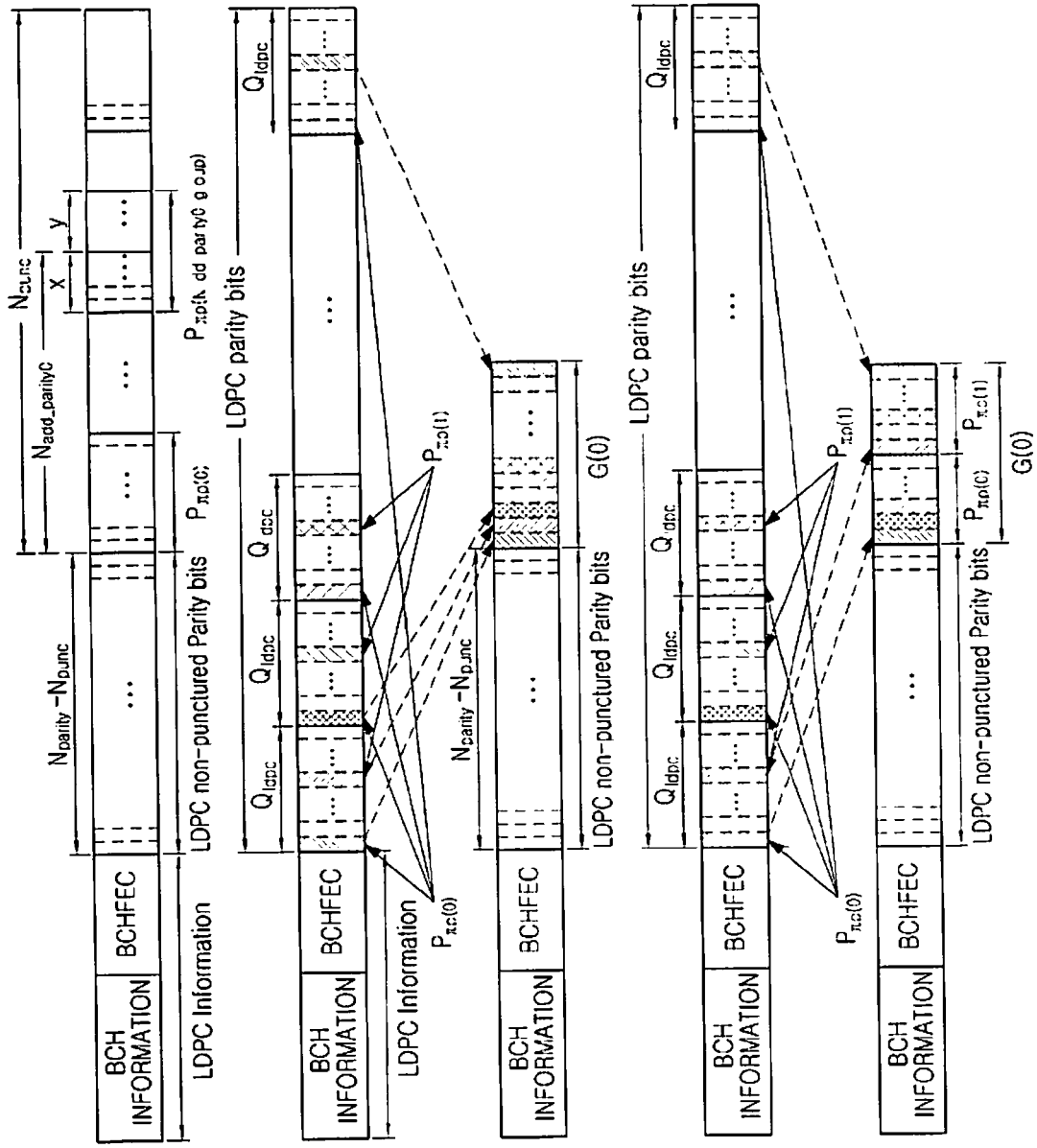
FIGS. 12 to 14 are diagrams illustrating methods of selecting additional parity bits according to different embodiments of the present invention.

There are several possible methods for determining order of bits in a group G(0) of first additional parity bits. For example, as illustrated in FIGS. 12A and 12C, bits are arranged in an order of a group $P_{\pi_p(a)}(0 \le a < Q_{ldpc})$ of parity bits in units of a group of $P_{\pi_p(a)}$ of parity bits. Also, as illustrated in FIG. 12B, parity bits selected for G(0) may be arranged in an order of indexes of parity bits on a bit-by-bit basis.

Step 7: In a group $$P_{\pi_p(N_{add\_parity_0\_group})},$$

the number of parity bits not included in the group G(0) of first additional parity bits may be calculated using Equation (13). Definitions of x and y are illustrated in FIGS. 12A to 12C.

$$y = \min(M - (N_{add\_parity_0} - M \times N_{add\_parity_0\_group}), N_{add\_parity_1}) \quad (13)$$

Therefore, a group G(1) of second additional parity bits can be created starting with an $$(N_{add\_parity_0} - M \times N_{add\_parity_0\_group})$$

-th bit in a group $$P_{\pi_p(N_{add\_parity_0\_group})}.$$

The term "a-th bit" refers to a bit located in an a-th position when the first bit in a group $$P_{\pi_p(N_{add\_parity_0\_group})}$$

is defined as a 0-th bit. In addition, min(a,b) represents a function of selecting one of a and b, which is the minimum value. For example, min(a,b)=a for a≤b, and min(a,b)=b for a>b.

Step 8: For $N_{add\_parity_1} > y$, the number of parity bit groups whose all elements are selected to select second additional parity bits, is calculated using Equation (14) below.

$$N_{add\_parity_1\_group} = \left\lfloor \frac{N_{add\_parity_1} - y}{M} \right\rfloor \quad (14)$$

Step 9: All parity bits in the groups $$P_{\pi_p(N_{add\_parity_0\_group}+1)}, P_{\pi_p(N_{add\_parity_0\_group}+2)},$$
$$\ldots, P_{\pi_p(N_{add\_parity_0\_group}+N_{add\_parity_1\_group})}$$

are included in a group of second additional parity bits.)

Step 10: In a group $$P_{\pi_p(N_{add\_parity_0\_group}+N_{add\_parity_1\_group}+1)},$$

$$(N_{add\_parity_1} - y - M \times N_{add\_parity_1\_group})$$

parity bits are created as second additional parity bits.

Step 11: In a group $$P_{\pi_p(N_{add\_parity_0\_group}+N_{add\_parity_0\_group}+1)},$$

the number y of parity bits not included in the group G(1) of second additional parity bits can be calculated using Equation (15).

$$x = N_{add\_parity_1} - y - M \times N_{add\_parity_1\_group} \quad (15)$$
$$y = \min(M - x, N_{add\_parity_2})$$

$$y = \min(M - x, N_{add\_parity_2}) \quad (15)$$

Therefore, y bits may be included in a group G(2) of third additional parity bits, starting with an x bit in the group $$P_{\pi_p(N_{add\_parity_0\_group}+N_{add\_parity_0\_group}+1)}.$$

Step 12: For $N_{add\_parity_2} > y$, the number of parity bit groups whose elements are all selected to select third additional parity bits, is calculated using Equation (16).

$$N_{add\_parity_2\_group} = \left\lfloor \frac{N_{add\_parity_2} - y}{M} \right\rfloor \quad (16)$$

Step 13: All parity bits in groups $$P_{\pi_p(N_{add\_parity_0\_group}+N_{add\_parity_1\_group}+2)},$$
$$P_{\pi_p(N_{add\_parity_0\_group}+N_{add\_parity_1\_group}+3)}, \ldots,$$
$$P_{\pi_p(N_{add\_parity_0\_group}+N_{add\_parity_1\_group}+N_{add\_parity_2\_group}+2)}$$

are included in a group of third additional parity bits.

Step 14: In a group $$P_{\pi_p(N_{add\_parity_0\_group}+N_{add\_parity_1\_group}+N_{add\_parity_2\_group}+3)},$$

$$(N_{add\_parity_2} - y - M \times N_{add\_parity_2\_group})$$

parity bits are created as third additional parity bits.

The method of determining an order of bits in a group G(1) of second additional parity bits is equal to the method of determining order of bits in a group G(0) of first additional parity bits.

Embodiment 8

Figures 13A, 13B, 13C:
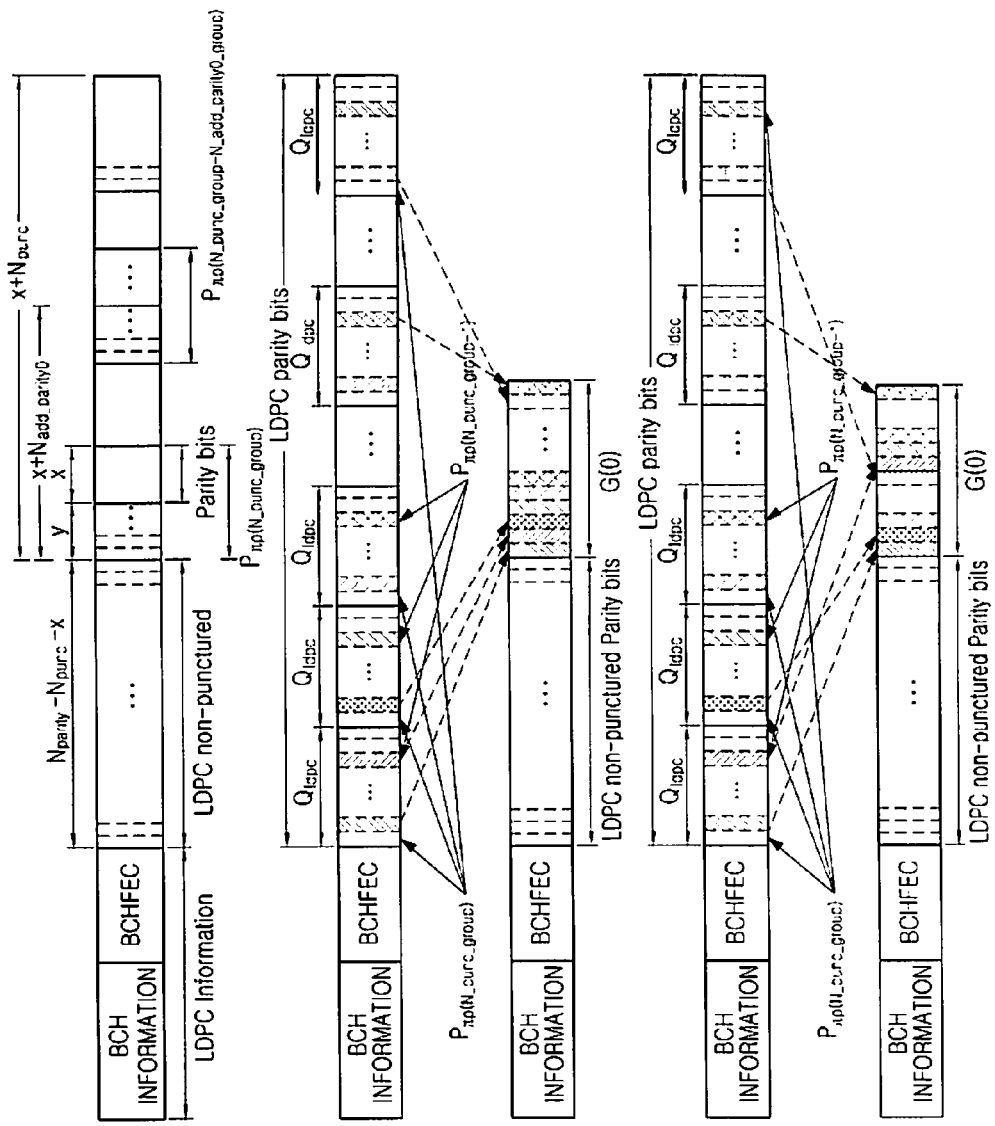

A method of selecting additional parity bits in a reverse order of a puncturing pattern will be described below with reference to FIGS. 13A to 13C.

A method of calculating parity bits transmitted on the same frames as the information bits corresponds to Steps 1 to 3, as described above.

A group G(0) of first additional parity bits is calculated in the following method.

Step 4: The number y of bits selected for a group G(0) in a group $$P_{\pi_p(N_{punc\_group})}$$

can be calculated using Equation (17).

$$y = \min(N_{punc} - M \times N_{punc\_group}, N_{add\_parity_0}) \tag{17}$$

Step 5: y bits are selected as first additional parity bits, starting with a first bit in the group $$P_{\pi_p(N_{punc\_group})}.$$

If $(N_{ldpc} - M \times N_{punc\_group})$ bits are punctured starting with the last parity bit in the group $$P_{\pi_p(N_{punc\_group})}$$

and non-punctured bits are transmitted on the same frames as the information bits in Step 3, y bits are selected as first additional parity bits, starting with the last parity bit in a group $$P_{\pi_p(N_{punc\_group})}$$

in Step 5.

If $N_{add\_parity_0}$ is greater than y, the following Steps 6-8 are performed.

Step 6: The number of parity bit groups whose all parity bits are selected for transmission, is calculated using Equation (18).

$$N_{add\_parity_0\_group} = \left\lfloor \frac{N_{add\_parity_0} - y}{M} \right\rfloor \tag{18}$$

Step 7: All parity bits in the $$N_{add\_parity_0\_group}$$

parity bit groups $$P_{\pi_p(N_{punc\_group}-1)}, P_{\pi_p(N_{punc\_group}-2)}, \ldots, P_{\pi_p(N_{punc\_group}-N_{add\_parity_0\_group})}$$

are selected for the group G(0) of first additional parity bits, and are transmitted on frames preceding the frames where the information bits are transmitted.

Step 8:

$$(N_{add\_parity_0} - M \times N_{add\_parity_0\_group} - y)$$

parity bits are selected for the group G(0) of first additional parity bits, starting with first parity bits in a group $$P_{\pi_p(N_{punc\_group}-N_{add\_parity_0\_group}-1)}.$$

There are several possible methods for determining an order of bits in a group G(0) of first additional parity bits. For example, as illustrated in FIGS. 13A and 13C, bits are arranged in reverse order of a group $P_{\pi_p(a)}(0 \le a < Q_{ldpc})$ of parity bits in units of the parity bit group $P_{\pi_p(a)}$. Also, as illustrated in FIG. 13B, parity bits selected as additional parity bits may be arranged in an order of indexes of parity bits on a bit-by-bit basis.

A group G(1) of second additional parity bits is created by Steps 9-12.

Step 9: The number y of bits selected for a group G(1) in a group $$P_{\pi_p(N_{punc\_group}-N_{add\_parity_0\_group})}$$

is calculated using Equation (19).

$$x = N_{add\_parity_0} - M \times N_{add\_parity_0\_group} - y \tag{19}$$

$$y = \min(M - x, N_{add\_parity_1})$$

$$y = \min(M - x, N_{add\_parity_1}) \tag{19}$$

Step 10: y bits are selected starting with a first bit in a group $$P_{\pi_p(N_{punc\_group} - N_{add\_parity_0\_group})}.$$

If $N_{add\_parity_1}$ is greater than y, the following process is performed.

Step 11: The number of parity bit groups whose all bits are transmitted, is calculated using Equation (20).

$$N_{add\_parity_1\_group} = \left\lfloor \frac{N_{add\_parity_1} - y}{M} \right\rfloor \quad (20)$$

Step 12: All parity bits in the $N_{add\_parity_1\_group}$ parity bit groups $$P_{\pi_p(N_{punc\_group} - N_{add\_parity_0\_group} - 1)},$$
$$P_{\pi_p(N_{punc\_group} - N_{add\_parity_0\_group} - 2)}, \ldots,$$
$$P_{\pi_p(N_{punc\_group} - N_{add\_parity_0\_group} - N_{add\_parity_1\_group})}$$

are included in a group G(1) of second additional parity bits, and are transmitted on frames preceding the frames in which the information bits are transmitted.

Step 13:

$$(N_{add\_parity_1} - M \times N_{add\_parity_1\_group} - y)$$

parity bits are included in a group G(1) of second additional parity bits, starting with first parity bits in a group $$P_{\pi_p(N_{punc\_group} - N_{add\_parity_0\_group} - N_{add\_parity_0\_group} - 1)}.$$

The method of determining order of bits in a group G(1) of second additional parity bits is equal to the method of determining order of bits in a group G(0) of first additional parity bits.

Embodiment 9

A method of more efficiently calculating additional parity bits by interleaving parity bits will be described below with reference to FIGS. 14A to 14D.

Parity bits $p = \{p_1, p_1, \ldots, p_{N_{parity}}\}$ obtained by LDPC encoding are interleaved in accordance with Equation (21).

$$d_{M \times t + s} = P_{Q_{ldpc} \times s + t} \text{ where } M \times Q_{ldpc} = N_{parity}, 0 \leq s < M, 0 \leq t < Q_{ldpc}$$

$$D_j = \{d_k | j \times M \leq k < (j+1) \times M\} \text{ for } 0 \leq j < Q_{ldpc} \quad (21)$$

The parity bit group is group-interleaved based on the $\pi_p(j)$, and can be presented as shown in Equation (22).

Figures 14A, 14B, 14C, 14D:
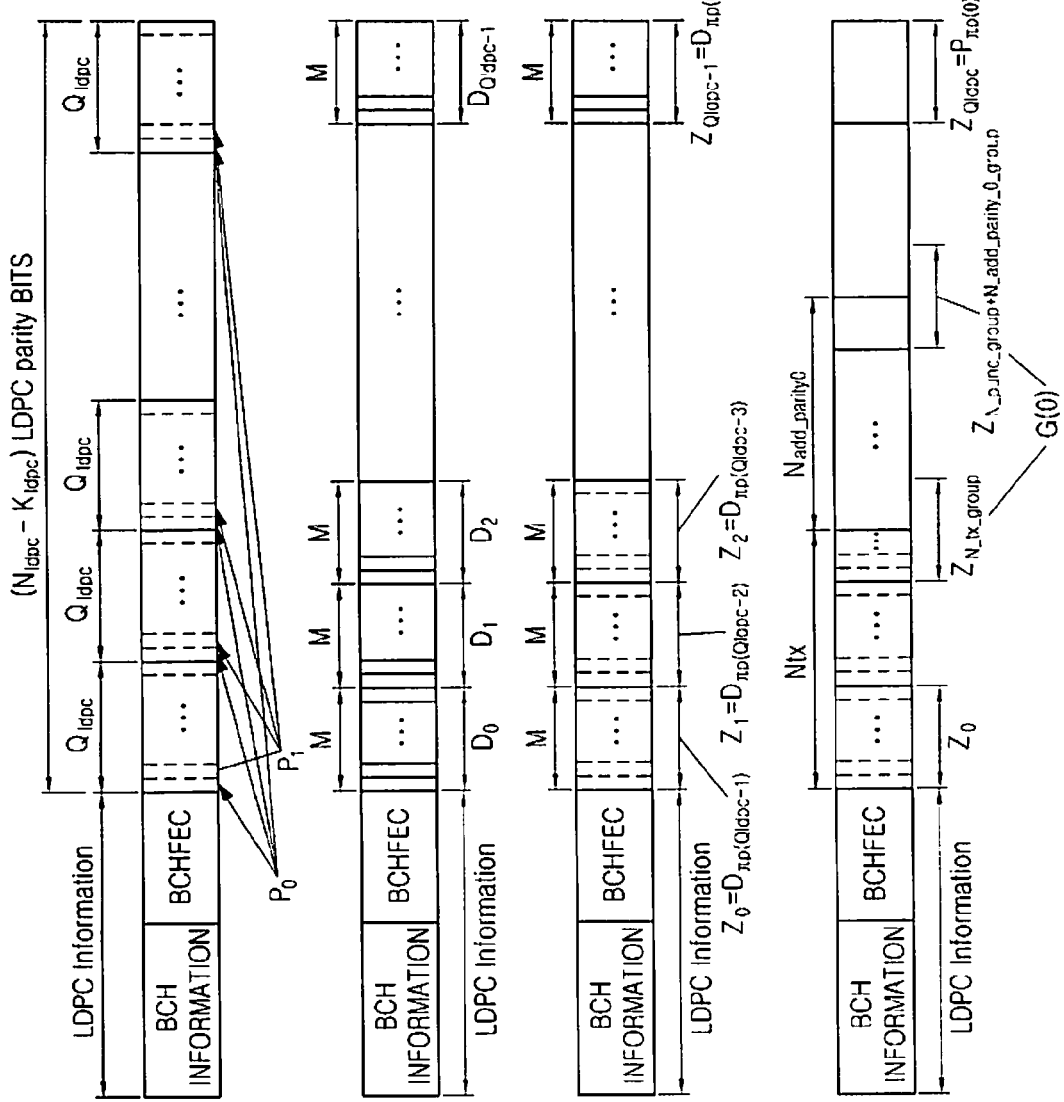

If interleaved by Equation (21), an LDPC codeword constructed as illustrated in FIG. 14A is arranged in units of a plurality of parity bit groups $P_a(0 \leq a < Q_{ldpc})$, as illustrated in FIG. 14B.

$$Z_i = D_{\pi_p(Q_{ldpc} - 1 - i)} \quad (22)$$

The group interleaving, or group-by-group interleaving, means that bits in a group are equally interleaved, and bits in a group Z, are equal to bits of $D_{\pi_p(Q_{ldpc} - 1 - i)}$. The $\pi_p(j)$, a value representing puncturing order, means the puncturing pattern for $0 \leq j < Q_{ldpc}$, which has been described in Table 1.

If interleaved by Equation (22), an LDPC codeword as illustrated in FIG. 14B is arranged such that a plurality of groups of parity bits are arranged in a reverse order of a puncturing pattern as in illustrated in FIG. 14C.

A method of calculating parity bits transmitted on the same frames as the information bits, is described below.

Step 1: The number $N_{tx\_group}$ of parity bit groups in which all parity bits are transmitted, can be calculated based on the number of punctured parity bits in accordance with Equation (23).

$$N_{tx\_group} = \left\lfloor \frac{N_{parity} - N_{punc}}{M} \right\rfloor \text{ for } 0 \leq N_{tx} < N_{ldpc} - K_{ldpc} \quad (23)$$

Step 2: All parity bits in the $N_{tx\_group}$ parity bit groups $$Z_0, Z_1, \ldots, Z_{N_{tx\_group} - 1}$$

are transmitted.

Step 3: $(N_{tx} - M \times N_{tx\_group})$ bits are transmitted on the same frames as those of information bits, starting with first parity bits in a group $$Z_{N_{punc\_group}}.$$

First additional parity bits are calculated using Steps 4-8.

Step 4: The number y of bits selected for a group G(0) in a group $$Z_{N_{punc\_group}}$$

can be calculated in accordance with Equation (24).

$$y = \min((N_{tx} - M \times N_{tx\_group}), N_{add\_parity_0}) \quad (24)$$

Step 5: y bits are selected as first additional parity bits, starting with a first bit in a group $$Z_{N_{punc\_group}}.$$

If $N_{add\_parity_0}$ is greater than y, Steps 6 and 7 are performed.

Step 6: The number of groups in which all bits are transmitted, is calculated using Equation (25).

$$N_{add\_parity_0\_group} = \left\lfloor \frac{N_{add\_parity_0} - y}{M} \right\rfloor \quad (25)$$

Step 7: All parity bits in the $N_{add\_parity_0\_group}$ parity bit groups $$z_{N_{punc\_group}+1}, \ldots, z_{N_{punc\_group}+N_{add\_parity_0\_group}}$$

are included in a group G(0) of first additional parity bits and are transmitted on frames preceding the frames where the information bits are transmitted.

Step 8:

$$(N_{add\_parity_0} - M \times N_{add\_parity_0\_group} - y)$$

parity bits are included in a group G(0) of first additional parity bits, starting with first parity bits in a group $$z_{N_{punc\_group}+N_{add\_parity_0\_group}+1}.$$

The group of additional parity bits is constructed as illustrated in FIG. 14D.

A group G(1) of second additional parity bits is created using steps 9-13.

Step 9: The number y of bits selected for a group G(1) in a group $$z_{N_{punc\_group}+N_{add\_parity_0\_group}+1}$$

can be calculated using Equation (26).

$$x = N_{add\_parity_0} - M \times N_{add\_parity_0\_group} - y \quad (26)$$
$$y = \min(M - x, N_{add\_parity_1})$$

$$y = \min(M - x, N_{add\_parity_1}) \quad (26)$$

Step 10: y bits are selected starting with a first bit in a group $$z_{N_{punc\_group}+N_{add\_parity_0\_group}+1}.$$

If $N_{add\_parity_1}$ is greater than y, Steps 11 to 13 are performed.

Step 11: The number of groups in which all bits are transmitted, is calculated using Equation (27).

$$N_{add\_parity_1\_group} = \left\lfloor \frac{N_{add\_parity_1} - y}{M} \right\rfloor \quad (27)$$

Step 12: All parity bits in the $N_{add\_parity_1\_group}$ parity bit groups $$z_{N_{punc\_group}+N_{add\_parity_0\_group}+2},$$

$$z_{N_{punc\_group}+N_{add\_parity_0\_group}+3}, \ldots,$$

$$z_{N_{punc\_group}+N_{add\_parity_0\_group}+1+N_{add\_parity_1\_group}}$$

are included in a group G(1) of second additional parity bits, and are transmitted on frames preceding the frames in which the information bits are transmitted.

Step 13:

$$(N_{add\_parity_1} - M \times N_{add\_parity_1\_group} - y)$$

parity bits are included in a group G(1) of second additional parity bits, starting with first parity bits in a group $$z_{N_{punc\_group}+N_{add\_parity_0\_group}+N_{add\_parity_1\_group}+2}.$$

Group interleaving of Equation (22) can be expressed as shown in Equation (28).

$$z_{l \times M+s} = d_{\pi_p(l) \times M+s}, \ 0 \leq l < Q_{ldpc}, \ 0 \leq s < M \quad (28)$$

In this case, parity bits may be represented as $z = z_0, z_1, z_2, \ldots, z_{N_{parity}}$.

Therefore, parity bits, which are selected even when additional parity bits are not used, may be selected based on the value $N_{tx}$ calculated in Equation (23), representing the number of parity bits transmitted on the same frames as those of the information bits, and on the additional parity bits $N_{add\_parity_0}$, and $N_{add\_parity_1}$.

Equation (29) represents a group $\hat{P}$ of parity bits transmitted on the same frames as the information word, a group G(0) of first additional parity bits, and a group G(1) of second additional parity bits.

$$\hat{P} = \{z_0, z_1, \ldots, z_{N_{tx}-1}\} \quad (29)$$
$$G(0) = \{z_{N_{tx}}, z_{N_{tx}+1}, z_{N_{tx}+2}, \ldots, z_{N_{tx}+N_{add\_parity_0}-1}\}$$
$$G(1) = \{z_{N_{tx}+N_{add\_parity_0}}, z_{N_{tx}+N_{add\_parity_0}+1},$$
$$z_{N_{tx}+N_{add\_parity_0}+2}, \ldots, z_{N_{tx}+N_{add\_parity_0}+N_{add\_parity_1}-1}\}$$

Figure 23:
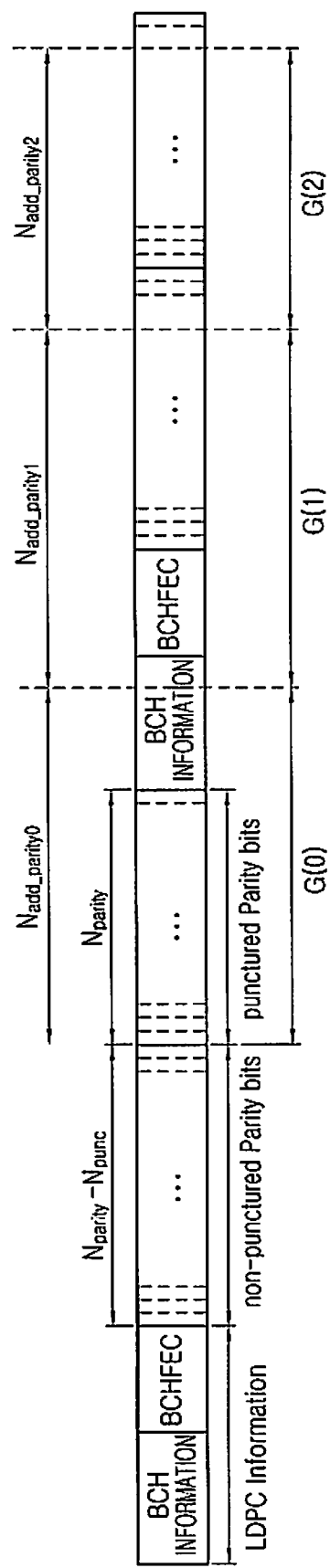
FIG. 23 is a diagram illustrating a method for selecting additional parity bits according to an embodiment of the present invention.

If the total number $N_{add\_parity_0} + \ldots + N_{add\_parity_{s-1}}$ of additional parity bits is greater than $N_{punc}$, $N_{punc}$ additional parity bits are selected in accordance with Embodiments 7 and 8. More additional parity bits, which are required exceeding $N_{punc}$, may be selected from the codeword, and the simplest way is to sequentially select the information word, parity bits transmitted in the same frames as those of the information word, and the selected additional parity bits, on a repeated basis, which is illustrated in FIG. 23 in brief.

Embodiment 10

A method of selecting additional parity bits in reverse order of a puncturing pattern is described below, wherein the total number $N_{add\_parity_0} + \ldots + N_{add\_parity_{s-1}}$ of additional parity bits is greater than $N_{punc}$.

This method of calculating parity bits transmitted on the same frames as the information bits corresponds to Steps 1 to 3, as described above.

A group $G(0)$ of first additional parity bits is calculated in Step 4.

Step 4: For $N_{add\_parity_0} > N_{punc}$, $N_{punc}$ bits are selected for a group $G(0)$, and $N_{add\_parity_0} - N_{punc}$ bits are selected from codeword bits, for the group $G(0)$. A simple method is to sequentially select the codeword bits and additional parity bits on a repeated basis, as illustrated in FIG. 23.

For $N_{add\_parity_0} < N_{punc}$, Steps 4 to 8 of Embodiment 8 are performed in the same way.

A group $G(1)$ of second additional parity bits is created in the following method.

Step 9: For $N_{add\_parity_0} > N_{punc}$ in Step 4, $G(1)$ is selected from the codeword bits. The simplest way is to sequentially select the previously transmitted bits.

For $N_{add\_parity_0} < N_{punc}$ and $N_{add\_parity_0} + N_{add\_parity_1} > N_{punc}$, $G(1)$ is selected from the codeword bits. A simple method is to sequentially select the information bits, parity bits, and additional parity bits on a repeated basis, as illustrated in FIG. 23.

For $N_{add\_parity_0} + N_{add\_parity_1} < N_{punc}$, Steps 9 to 13 of Embodiment 8 are performed in the same way.

Figure 15:
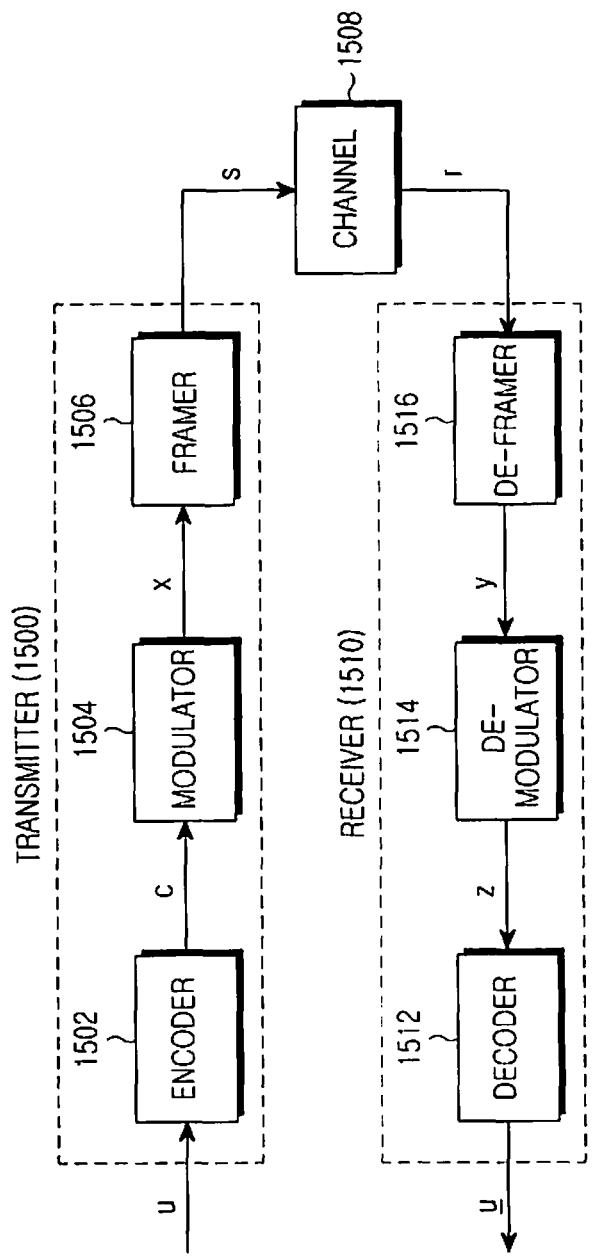
FIG. 15 is a block diagram illustrating a transmission and reception apparatus according to an embodiment of the present invention.

FIG. 15 is a block diagram illustrating a transmission and reception apparatus according to an embodiment of the present invention.

Referring to FIG. 15, a transmitter 1500 includes an encoder 1502, a modulator 1504, and a framer 1506. A message u is encoded by the encoder 1502, modulated by the modulator 1504, and framed by the framer 1506 before being transmitted over a channel 1508. The transmitted signal is received at a receiver 1510 including a de-framer 1516, a demodulator 1514, and a decoder 1512. The received signal r is de-framed by a de-framer 1516 and a signal y is input to the demodulator 1514. The decoder 1512 calculates an estimate of a message from a signal z demodulated by the demodulator 1514.

The encoder 1502 generates parity bits by performing puncturing and shortening in a predetermined manner according to the size of the message.

Figure 16:
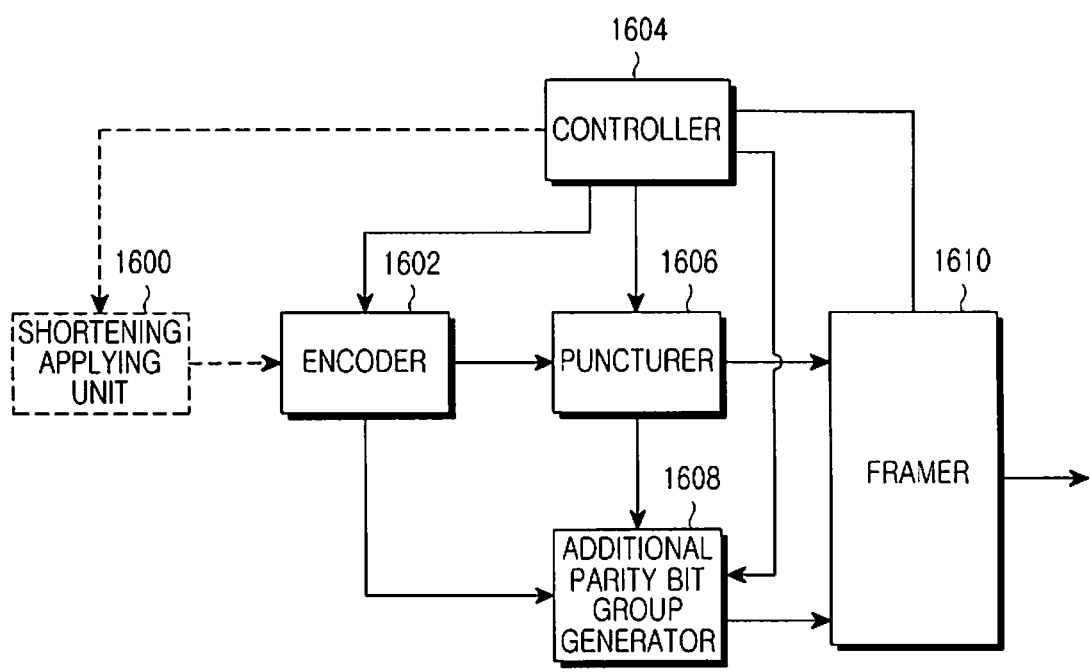
FIG. 16 is a block diagram illustrating a transmission apparatus according to an embodiment of the present invention.

FIG. 16 is a block diagram illustrating a transmission apparatus using a shortened LDPC code according to an embodiment of the present invention.

Referring to FIG. 16, the transmission apparatus includes an encoder 1602, a controller 1604, a puncturer 1606, an additional parity bit group generator 1608, and a framer 1610. Optionally, the transmission apparatus may include a shortening applying unit 1600.

The controller 1604 determines the number of bits that the shortening applying unit 1600 will shorten according to the length of an information word. The shortening applying unit 1600 inserts a bit having a value of 0 in a position corresponding to a shortened bit, or removes a column corresponding to a shortened bit from a parity check matrix of a given LDPC code. A method for determining the shortening pattern includes using a shortening pattern stored in a memory, generating a shortening pattern using a sequence generator (not shown), or obtaining a shortening pattern by using a density evolution analysis algorithm for a parity check matrix and a given information word length.

The LDPC encoder 1602 performs encoding based on an LDPC code shortened by the controller 1604 and the shortening applying unit 1600. In addition, puncturing is required, puncturing is applied to a generated LDPC codeword by the puncturer 1606. The number of and positions of bits the puncturer 1606 should puncture are determined by the controller 1604 according to a puncturing pattern. That is, knowing a puncturing pattern or puncturing order, the controller 1604 selects the bits to be punctured according to the puncturing order. The puncturing pattern may be stored in a memory, or may be generated using a sequence generator (not shown).

The additional parity bit group generator 1608 receives output data of the controller 1604 and the encoder 1602, and data from the puncturer 1606, and based thereon, generates additional parity bit groups in accordance with the above-described rules.

The framer 1610 generates frames corresponding to Methods 1 and 2, as described above.

Figure 17:
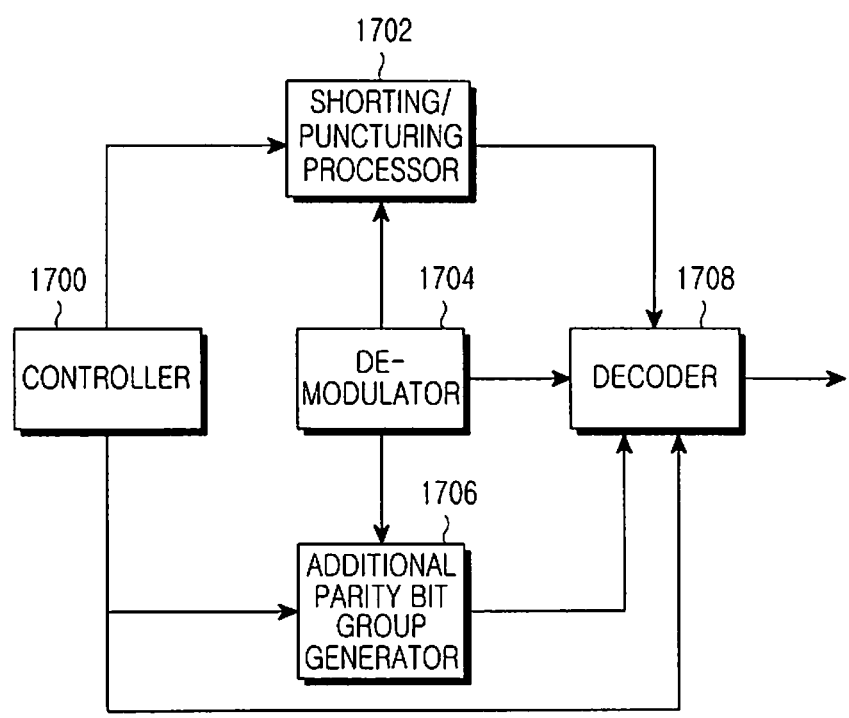
FIG. 17 is a block diagram illustrating a reception apparatus according to an embodiment of the present invention.

FIG. 17 is a block diagram illustrating a reception apparatus using an LDPC code to which additional parity bit groups are applied, according to an embodiment of the present invention. Specifically, the example of the reception apparatus illustrated in FIG. 17 receives a signal transmitted from a communication system using the additional parity bit groups, and restores user-desired data from the received signal upon acquiring information about additional parity bits constituting the additional parity bit groups, from the received signal.

Referring to FIG. 17, the reception apparatus includes a controller 1700, a shortening/puncturing processor 1702, a demodulator 1704, an additional parity bit group processor 1706, and a decoder 1708. The demodulator 1704 receives and demodulates an LDPC code, reconstructs a frame by the controller 1700, and estimates an input value to the LDPC encoder in FIG. 16 based on the received signal. The demodulator 1704 delivers the demodulated signal to the shortening/puncturing processor 1702, the decoder 1708, and the additional parity bit group processor 1706.

The shortening/puncturing processor 1702, under control of the controller 1700, determines information about the shortened/punctured bits of an LDPC code based on the signal demodulated by the demodulator 1704, and delivers position information of the shortened/punctured bits to the decoder 1708.

The decoder 1708 restores user-desired data from the received signal using an output value of the demodulator 1704, and length information of the shortened/punctured code and position information of the shortened/punctured bits, received from the shortening/puncturing processor 1702. The decoder 1708 performs decoding by receiving position information of additional parity bits and a demodulation value from the additional parity bit group processor 1706.

The additional parity bit group processor 1706, under control of the controller 1700, processes position information of additional parity bits and demodulated data, and delivers the processed data to the decoder 1708. Processing demodulated data may vary in meaning. For example, values demodulated when the same bits are received several times, may be added.

Figure 18:
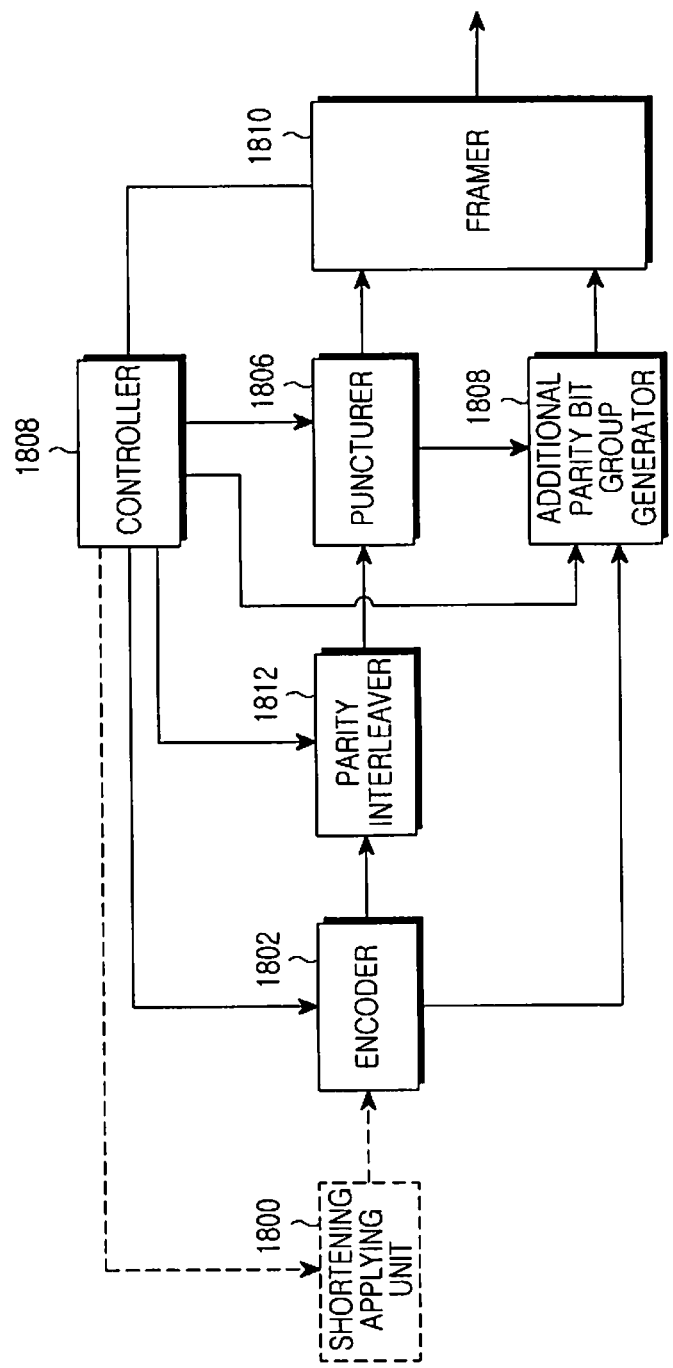
FIG. 18 is a block diagram illustrating a transmission apparatus according to an embodiment of the present invention.

FIG. 18 is a block diagram illustrating a transmission apparatus using a shortened LDPC code according to an embodiment of the present invention.

Referring to FIG. 18, the transmission apparatus includes an encoder 1802, a controller 1804, a puncturer 1806, an additional parity bit group generator 1808, a framer 1810, and a parity interleaver 1812. Optionally, the transmission apparatus may include a shortening applying unit 1800.

The controller 1804 determines the number of bits that the shortening applying unit 1800 will shorten, according to the length of an information word. The shortening applying unit 1800 inserts a bit having a value of 0 in a position corresponding to a shortened bit, or removes a column corresponding to a shortened bit from a parity check matrix of a given LDPC code. A method for determining the shortening pattern includes using a shortening pattern stored in a memory, generating a shortening pattern using a sequence generator (not shown), or obtaining a shortening pattern by using a density evolution analysis algorithm for a parity check matrix and a given information word length.

The encoder 1802 performs encoding based on an LDPC code shortened by the controller 1804 and the shortening applying unit 1800. Output values of the encoder 1802 are parity-interleaved by the parity interleaver 1812 on a group basis or on a bit basis, as described above in Embodiment 9.

As described above, the parity interleaver 1812 performs interleaving according to a puncturing pattern under control of the controller 1808. In addition, if puncturing is required, puncturing is applied to a generated LDPC codeword by the puncturer 1806. The number of and positions of bits the puncturer 1806 should puncture are determined by the controller 1804 according to a puncturing pattern. That is, knowing the puncturing pattern (or a puncturing order), the controller 1804 selects the bits punctured according to the puncturing pattern. The puncturing pattern may be stored in a memory, or may be generated using a sequence generator (not shown).

The additional parity bit group generator 1808 receives output data of the controller 1804 and the encoder 1802, and data from the puncturer 1806, and based thereon, generates additional parity bit groups in accordance with the above-described rules.

The framer 1810 generates frames corresponding to Methods 1 and 2, as described above.

Figure 19:
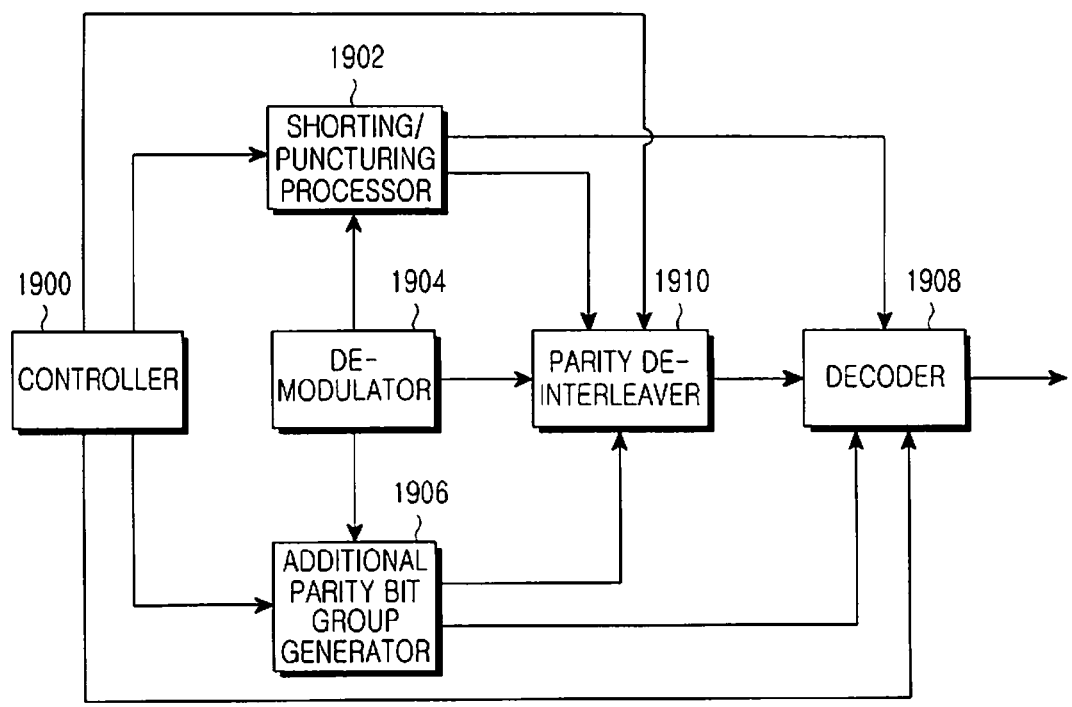
FIG. 19 is a block diagram illustrating a reception apparatus according to an embodiment of the present invention.

FIG. 19 is a block diagram illustrating a reception apparatus using an LDPC code to which additional parity bit groups are applied, according to an embodiment of the present invention. Specifically, the example of the reception apparatus illustrated in FIG. 19 receives a signal transmitted from a communication system using the additional parity bit groups, and restores user-desired data from the received signal upon acquiring information about additional parity bits constituting the additional parity bit groups, from the received signal.

Referring to FIG. 19, the reception apparatus includes a controller 1900, a shortening/puncturing processor 1902, a demodulator 1904, an additional parity bit group processor 1906, a decoder 1908, and a parity deinterleaver 1910. The demodulator 1904 receives and demodulates an LDPC code, and delivers the demodulated signal to the shortening/puncturing processor 1902, the decoder 1908, and the additional parity bit group processor 1906.

The shortening/puncturing processor 1902, under control of the controller 1900, acquires information about shortened/punctured bits of an LDPC code from the signal demodulated by the demodulator 1904, and delivers the position information of the shortened/punctured bits to the decoder 1908.

The parity deinterleaver 1910, which corresponds to the parity interleaver 1812 illustrated in FIG. 18, reconstructs parity bits using an output value of the demodulator 1904, and length information of the shortened/punctured code and position information of the shortened/punctured bits, received from the shortening/puncturing processor 1902, and performs parity deinterleaving thereon.

The decoder 1908 restores user-desired data from the received signal using an output value of the parity deinterleaver 1910, and length information of a shortened/punctured code and position information of the shortened/punctured bits, received from the shortening/puncturing processor 1902. The decoder 1908 receives position information of additional parity bits and a demodulation value from the additional parity bit group processor 1906, and performs decoding thereon.

The additional parity bit group processor 1906, under control of the controller 1900, processes position information of the additional parity bits and the demodulated data, and delivers the processed data to the decoder 1908. Processing demodulated data may vary in meaning. For example, values demodulated when the same bits are received several times, may be added.

Figure 20:
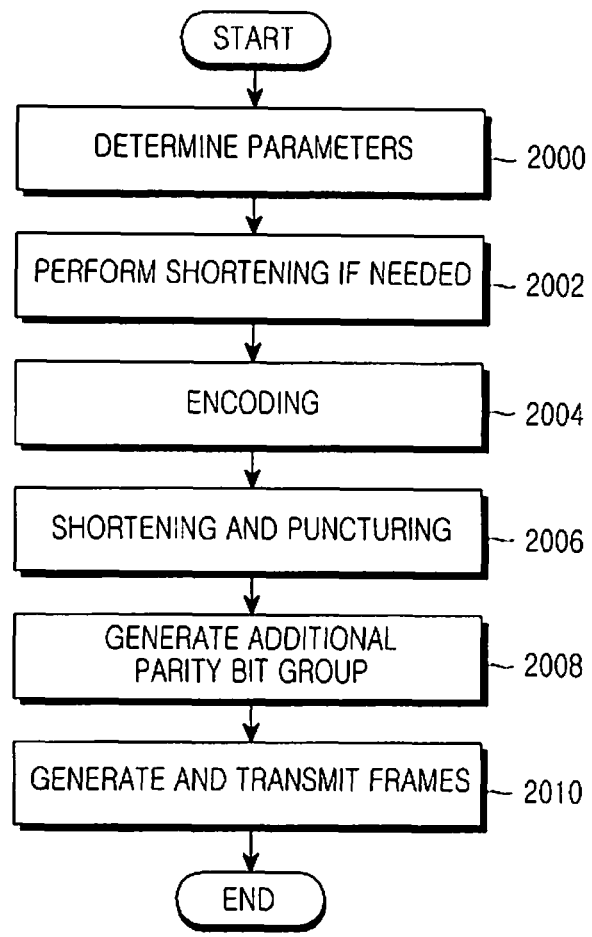
FIG. 20 is a flowchart illustrating a transmission method according to an embodiment of the present invention.

FIG. 20 is a flowchart illustrating a transmission method according to an embodiment of the present invention.

Referring to FIG. 20, in step 2000, the controller 1604 (or 1804) determines the number of bits for puncturing and shortening, the number of frames for carrying parity bits, and the number of bits and groups transmitted on each frame, in accordance with the above-described methods and rules.

In step 2002, the shortening applying unit 1600 (or 1800) performs shortening as needed. In step 2004, the encoder 1602 (or 1802) performs LDPC encoding using the determined parameters. In step 2006, the puncturer 1606 (or 1806) shortens/punctures the encoded bits. In step 2008, the additional parity bit group generator 1608 (or 1808) generates a plurality of additional parity bit groups using the codeword bits and parity bits in accordance with Rules 3 to 5. Step 2008 may also include a parity interleaving process. In step 2010, the framer 1610 (or 1810) transmits the codeword and the additional parity bit groups on a plurality of frames in accordance with the various methods according to the above-described embodiments of the present invention.

Figure 21:
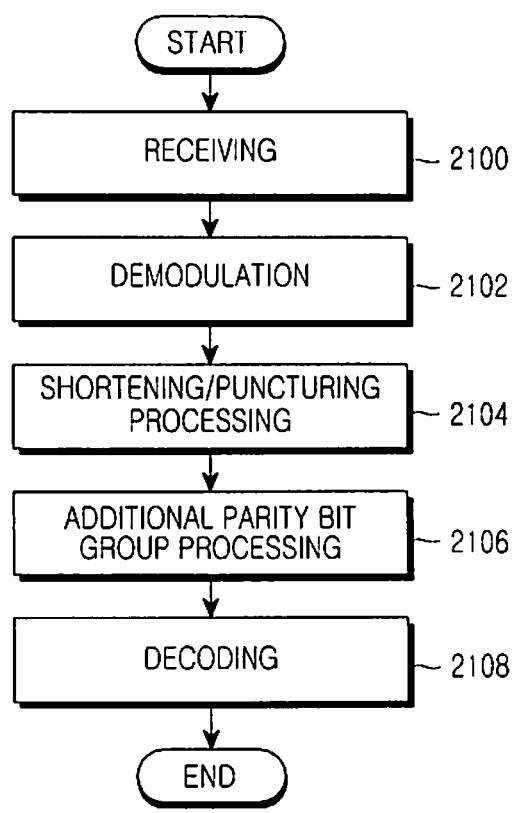
FIG. 21 is a flowchart illustrating a reception method according to an embodiment of the present invention.

FIG. 21 is a flowchart illustrating a reception operation of a reception apparatus according to an embodiment of the present invention.

Referring to FIG. 21, in step 2100, the reception apparatus receives a code. In step 2102, the demodulator 1704 (or 1904) demodulates the received signal. Thereafter, in step 2104, the shortening/puncturing processor 1702 (or 1902) performs shortening/puncturing on the demodulated signal.

If there are no shortened/punctured bits, the decoder 1708 (or 1908) performs decoding in step 2108, skipping step 2106. However, if there are shortened/punctured bits, the shortening/puncturing processor 1702 (or 1902) delivers position information of shortened/punctured bits to the decoder 1708 (or 1908) and the additional parity bit group processor 1706 (or 1906) delivers position information of the additional parity bits to the decoder 1708 (or 1908), in step 2106.

In step 2108, considering that a probability that values of the shortened bits will be 0 is 1, based on the position information of the shortened/punctured bits, the decoder 1708 (or 1908) performs LDPC decoding, after determining that the punctured bits are erased bits.

As is apparent from the foregoing description, according to the above-described embodiments of the present invention, additional diversity gain may be obtained by transmitting parity bits over a plurality of frames.

In addition, by transmitting additional parity bits on a plurality of frames, the various embodiments of the present invention minimize for the use of an additional module in an encoding/decoding process, while increasing diversity gain.

While the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A method for transmitting encoded data, comprising:
generating parity bits for an information word;
generating a codeword by encoding the information word using the generated parity bits;
puncturing some of the parity bits of the codeword;
transmitting a frame including the information word; and
generating additional parity bits for decoding the information word and transmitting the additional parity bits in one or more other frames.

2. The method of claim 1, wherein puncturing some of the parity bits comprises puncturing some of the parity bits according to a specific puncturing pattern.

3. The method of claim 2, wherein the additional parity bits are generated by selecting the additional parity bits based on a puncturing order of the specific puncturing pattern or a reverse order of the puncturing order.

4. The method of claim 3, wherein the additional parity bits are generated by first selecting remaining bits except for the punctured bits.

5. The method of claim 4, wherein if the remaining bits except for the punctured bits are all selected as the additional parity bits, all or some of the information bits or all or some of the punctured parity bits are selected as the additional parity bits.

6. The method of claim 3, wherein the additional parity bits are generated by first selecting the punctured bits.

7. The method of claim 6, wherein if the punctured bits are all selected as the additional parity bits, all or some of the information bits or all or some of non-punctured parity bits are selected as the additional parity bits.

8. The method of claim 1, wherein the additional parity bits are generated by selecting the additional parity bits based on an order of remaining bits except for the punctured bits or an inverse order thereof.

9. The method of claim 8, wherein if the remaining bits except for the punctured bits are all selected as the additional parity bits, all or some of the information bits or all or some of the punctured parity bits are selected as the additional parity bits.

10. The method of claim 1, wherein the one or more other frames precede the frame including the information word.

11. The method of claim 1, wherein the additional parity bits are transmitted in a data stream or an auxiliary stream, or at a preamble symbol or other Radio Frequency (RF).

12. An apparatus for transmitting encoded data, comprising:
an encoder for generating parity bits for an information word, and generating a codeword by encoding the information word;
a puncturer for puncturing some of the parity bits of the codeword encoded by the encoder; and
a framer for generating a frame including the information word, and one or more other frames including additional parity bits for decoding the information word.

13. The apparatus of claim 12, wherein the puncturer punctures some of the parity bits according to a specific puncturing pattern.

14. The apparatus of claim 13, further comprising a controller for selecting the additional parity bits based on a puncturing order of the specific puncturing pattern or a reverse order of the puncturing order.

15. The apparatus of claim 14, wherein the controller first selects remaining bits except for the punctured bits, as the additional parity bits.

16. The apparatus of claim 15, wherein if the remaining bits except for the punctured bits are all selected as the additional parity bits, the controller selects all or some of the information bits or all or some of the punctured parity bits, as the additional parity bits.

17. The apparatus of claim 14, wherein the controller first selects the punctured bits as the additional parity bits.

18. The apparatus of claim 17, wherein if the punctured bits are all selected as the additional parity bits, the controller selects all or some of the information bits or all or some of non-punctured parity bits, as the additional parity bits.

19. The apparatus of claim 12, further comprising a controller for selecting the additional parity bits based on an order of remaining bits except for the punctured bits or an inverse order thereof.

20. The apparatus of claim 19, wherein if the remaining bits except for the punctured bits are all selected as the additional parity bits, the controller selects all or some of the information bits or all or some of the punctured parity bits, as the additional parity bits.

21. The apparatus of claim 12, wherein the one or more other frames precede the frame including the information word.

22. The apparatus of claim 12, wherein the additional parity bits are transmitted in a data stream or an auxiliary stream, or at a preamble symbol or other Radio Frequency (RF).

23. A method for receiving encoded data, comprising:
receiving a plurality of frames; and
obtaining an information word by decoding one of the plurality of frames, wherein the information word is encoded using parity bits and some of the parity bits are punctured,
wherein one or more frames, other than the frame that includes the information word, includes additional parity bits for decoding the information word.

24. The method of claim 23, wherein the additional parity bits are generated by:
generating the parity bits for the information word;
generating a codeword by encoding the information word using the generated parity bits; and
puncturing some of the parity bits of the codeword.

25. The method of claim 24, wherein puncturing some of the parity bits comprises puncturing some of the parity bits according to a specific puncturing pattern.

26. The method of claim 25, wherein the additional parity bits are selected based on a puncturing order of the specific puncturing pattern or a reverse order of the puncturing order.

27. The method of claim 26, wherein remaining bits except for the punctured bits are first selected as the additional parity bits.

28. The method of claim 27, wherein if the remaining bits except for the punctured bits are all selected as the additional parity bits, all or some of the information bits or all or some of the punctured parity bits are selected as the additional parity bits.

29. The method of claim 26, wherein the punctured bits are first selected as the additional parity bits.

30. The method of claim 29, wherein if the punctured bits are all selected as the additional parity bits, all or some of the information bits or all or some of non-punctured parity bits are selected as the additional parity bits.

31. The method of claim 24, wherein the additional parity bits are selected based on an order of remaining bits except for the punctured bits or an inverse order thereof.

32. The method of claim 31, wherein if the remaining bits except for the punctured bits are all selected as the additional parity bits, all or some of the information bits or all or some of the punctured parity bits are selected as the additional parity bits.

33. The method of claim 23, wherein the one or more other frames precede the frame including the information word.

34. An apparatus for receiving encoded data, comprising:
a demodulator for receiving and demodulating a plurality of frames; and
a decoder for obtaining an information word by decoding one of the plurality of frames, wherein the information word is encoded using parity bits and some of the parity bits are punctured,
wherein one or more frames, other than the frame that includes the information word, includes additional parity bits for decoding the information word.

35. The apparatus of claim 34, wherein the additional parity bits are generated, as some of the parity bits of a codeword encoded using the parity bits generated for the information word are punctured.

36. The apparatus of claim 35, wherein some of the parity bits are punctured according to a specific puncturing pattern.

37. The apparatus of claim 36, further comprising a controller for obtaining information about the addition parity bits based on a puncturing order of the specific puncturing pattern or a reverse order of the puncturing order.

38. The apparatus of claim 37, wherein the controller determines that remaining bits except for the punctured bits are first selected as the additional parity bits.

39. The apparatus of claim 38, wherein if it is determined that the remaining bits except for the punctured bits are all selected as the additional parity bits, the controller determines that all or some of the information bits or all or some of the punctured parity bits are selected as the additional parity bits.

40. The apparatus of claim 37, wherein the controller determines that the punctured bits are first selected as the additional parity bits.

41. The apparatus of claim 40, wherein if the punctured bits are all selected as the additional parity bits, the controller determines that all or some of the information bits or all or some of non-punctured parity bits are selected as the additional parity bits.

42. The apparatus of claim 35, further comprising a controller for obtaining information about the additional parity bits based on an order of remaining bits except for the punctured bits or an inverse order thereof.

43. The apparatus of claim 42, wherein if the remaining bits except for the punctured bits are all selected as the additional parity bits, the controller determines that all or some of the information bits or all or some of the punctured parity bits are selected as the additional parity bits.

44. The apparatus of claim 34, wherein the one or more other frames precede the frame including the information word.

45. A method for transmitting encoded data, comprising:
generating a codeword by encoding an information word;
puncturing some parity bits in the generated codeword;
transmitting a frame including the punctured codeword; and
transmitting additional parity bits for decoding the information word in one or more frames preceding the frame.

46. The method of claim 45, wherein the parity bits are formed in one or more parity bit groups.

47. The method of claim 46, wherein the additional parity bits are generated by:
determining the number of bits which are selected as the additional parity bits from a parity bit group, only part of which is punctured, among the parity bit groups;
if a predetermined number of additional parity bits is greater than the number of selected bits, determining the number of groups, all bits in which are selected as the additional parity bits, among the parity bit groups;
selecting all bits in the parity bit group corresponding to the predetermined number of groups, as the additional parity bits; and
if the predetermined number of additional parity bits is greater than the determined number of additional parity bits, selecting some bits in one parity bit group as the additional parity bits.

48. The method of claim 47, wherein determining the number of bits comprises determining a smaller number of the number of punctured bits in a parity bit group, only part of which is punctured, among the parity bit groups and the predetermined number of additional parity bits, and are determined based on the following equation:

$$y = \min(N_{punc} - M \times N_{punc\_group}, N_{add\_parity_0}).$$

49. The method of claim 47, wherein determining the number of groups is based on the following equation:

$$N_{add\_parity_0\_group} = \left\lfloor \frac{N_{add\_parity_0} - y}{M} \right\rfloor.$$

50. The method of claim 47, wherein selecting some bits in one parity bit group as the additional parity bits is based on the following equation:

$$(N_{add\_parity_0} - M \times N_{add\_parity_0\_group} - y).$$

51. An apparatus for transmitting encoded data, comprising:
an encoder for generating a codeword by encoding an information word;
a puncturer for puncturing some parity bits in the generated codeword; and
a framer for generating a frame including the punctured codeword,
wherein the framer generates a frame such that one or more frames preceding the frame including the punctured codeword include additional parity bits for decoding the information word.

52. The apparatus of claim 51, wherein the parity bits are formed in one or more parity bit groups.

53. The apparatus of claim 52, further comprising an additional parity bit generator for generating the additional parity bits by determining the number of bits which are selected as the additional parity bits from a parity bit group, only part of which is punctured, among the parity bit groups, if a predetermined number of additional parity bits is greater than the number of selected bits, determining the number of groups, all bits in which are selected as the additional parity bits, among the parity bit groups, selecting all bits in the parity bit group corresponding to the predetermined number of groups, as the additional parity bits, and if the predetermined number of additional parity bits is greater than the determined number of additional parity bits, selecting some bits in one parity bit group as the additional parity bits.

54. The apparatus of claim 53, wherein the number of bits which are selected as the additional parity bits from a parity bit group, only part of which is punctured, among the parity bit groups, is determined as a smaller number of the number of punctured bits in a parity bit group, only part of which is punctured, among the parity bit groups and the predetermined number of additional parity bits, and are determined based on the following equation:

$$y = \min(N_{punc} - M \times N_{punc\_group}, N_{add\_parity_0}).$$

55. The apparatus of claim 53, wherein the number of groups, all bits in which are selected as the additional parity bits, is determined based on the following equation:

$$N_{add\_parity_0\_group} = \left\lfloor \frac{N_{add\_parity_0} - y}{M} \right\rfloor.$$

56. The apparatus of claim 53, wherein the number of some bits in one parity bit group, which are selected as the additional parity bits, is determined based on the following equation:

$$(N_{add\_parity_0} - M \times N_{add\_parity_0\_group} - y).$$

57. A method for receiving encoded data, comprising:
receiving a plurality of frames, wherein some of parity bits are punctured;
obtaining positions of the punctured parity bits; and
obtaining an information word by decoding data of the received plurality of frames, taking into account the obtained positions of the punctured parity bits,
wherein one frame among the plurality of frames includes a punctured codeword, and one or more other frames include additional parity bits for decoding the information word.

58. The method of claim 57, wherein the parity bits are formed in one or more parity bit groups.

59. The method of claim 58, wherein the additional parity bits are generated by:
determining the number of bits which are selected as the additional parity bits from a parity bit group, only part of which is punctured, among the parity bit groups;
if a predetermined number of additional parity bits is greater than the number of selected bits, determining the number of groups, all bits in which are selected as the additional parity bits, among the parity bit groups;
selecting all bits in the parity bit group corresponding to the predetermined number of groups, as the additional parity bits; and
if the predetermined number of additional parity bits is greater than the determined number of additional parity bits, selecting some bits in one parity bit group as the additional parity bits.

60. The method of claim 59, wherein determining the number of bits comprises determining a smaller number of the number of punctured bits in a parity bit group, only part of which is punctured, among the parity bit groups and the predetermined number of additional parity bits, and are determined based on the following equation:

$$y = \min(N_{punc} - M \times N_{punc\_group}, N_{add\_parity_0}).$$

61. The method of claim 59, wherein determining the number of groups is based on the following equation:

$$N_{add\_parity_0\_group} = \left\lfloor \frac{N_{add\_parity_0} - y}{M} \right\rfloor.$$

62. The method of claim 59, wherein selecting some bits in one parity bit group as the additional parity bits is based on the following equation:

$$(N_{add\_parity_0} - M \times N_{add\_parity_0\_group} - y).$$

63. An apparatus for receiving encoded data, comprising:
a demodulator for receiving and demodulating a plurality of frames, wherein some of parity bits are punctured;
a puncturing processor for obtaining positions of the punctured parity bits; and
a decoder for obtaining an information word by decoding data of the received plurality of frames, taking into account the obtained positions of the punctured parity bits,
wherein one frame among the plurality of frames includes a punctured codeword, and one or more other frames include additional parity bits for decoding the information word.

64. The apparatus of claim 63, wherein the parity bits are formed in one or more parity bit groups.

65. The apparatus of claim 64, further comprising an additional parity bit processor for obtaining positions of the additional parity bits by determining the number of bits which are selected as the additional parity bits from a parity bit group, only part of which is punctured, among the parity bit groups, if a predetermined number of additional parity bits is greater than the number of selected bits, determining the number of groups, all bits in which are selected as the additional parity bits, among the parity bit groups, selecting all bits in the parity bit group corresponding to the predetermined number of groups, as the additional parity bits, and if the predetermined number of additional parity bits is greater than the determined number of additional parity bits, selecting some bits in one parity bit group as the additional parity bits.

66. The apparatus of claim 65, wherein the number of bits which are selected as the additional parity bits from a parity bit group, only part of which is punctured, among the parity bit groups is determined as a smaller number of the number of punctured bits in a parity bit group, only part of which is punctured, among the parity bit groups and the predetermined number of additional parity bits, and are determined based on the following equation:

$$y = \min(N_{punc} - M \times N_{punc\_group}, N_{add\_parity_0}).$$

67. The apparatus of claim 65, wherein the number of groups, all bits in which are selected as the additional parity bits, is determined based on the following equation:

$$N_{add\_parity_0\_group} = \left\lfloor \frac{N_{add\_parity_0} - y}{M} \right\rfloor.$$

68. The apparatus of claim 65, wherein the number of some bits in one parity bit group, which are selected as the additional parity bits, is determined based on the following equation:

$$(N_{add\_parity_0} - M \times N_{add\_parity_0\_group} - y).$$

* * * * *